(12) United States Patent
Champion

(10) Patent No.: US 7,046,249 B2
(45) Date of Patent: May 16, 2006

(54) SWAPPED PIXEL PAGES

(75) Inventor: Mark Champion, Kenmore, WA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 0 days.

(21) Appl. No.: 10/882,490

(22) Filed: Jun. 30, 2004

(65) Prior Publication Data

US 2004/0246258 A1  Dec. 9, 2004

Related U.S. Application Data

(63) Continuation of application No. 10/077,131, filed on Feb. 15, 2002, now Pat. No. 6,850,241.

(60) Provisional application No. 60/269,784, filed on Feb. 15, 2001, provisional application No. 60/269,783, filed on Feb. 15, 2001, and provisional application No. 60/324,498, filed on Sep. 24, 2001.

(51) Int. Cl.
*G06F 13/00* (2006.01)

(52) U.S. Cl. .................. 345/531; 345/536; 345/540; 711/157

(58) Field of Classification Search ............... 345/531, 345/536, 539–540, 545–546; 711/127, 157, 711/168
See application file for complete search history.

(56) References Cited

U.S. PATENT DOCUMENTS

| | | | |
|---|---|---|---|
| 4,189,767 A | 2/1980 | Ahuja |
| 4,449,199 A | 5/1984 | Daigle |
| 5,142,276 A | 8/1992 | Moffat |
| 5,195,182 A | 3/1993 | Sasson |

(Continued)

OTHER PUBLICATIONS

SMPTE Standard for Television 1920 x 1080 Scanning and Parallel Digital Interfaces for Multiple Picture Rates SMPTE 274–1998; Copyright 1998; pp 1–24; Revision of ANSI/SMPTE 274M–1995; The Society of Motion Picture and Television Engineers; White Plains, New York.

Bloom, DM; "The Grating Light Valve: revolutionizing display technology;" pp 1–10; Silicon Light Machines (formerly Echelle, Inc).

(Continued)

*Primary Examiner*—Matthew C. Bella
*Assistant Examiner*—Mackly Monestime
(74) *Attorney, Agent, or Firm*—Thomas F. Lebens; Fitch, Even, Tabin & Flannery

(57) ABSTRACT

Methods and apparatus for implementing a pixel page system providing swapped pixel pages for use with a GLV (grating light valve). In one implementation, a swapped pixel page system includes: a data source, providing pixel data for pixels in a first order, where each pixel is in a frame of pixels, the frame having horizontal rows of pixels, vertical columns of pixels, a first portion and a second portion; a data destination, receiving pixel data for pixels in a second order; and at least two memory devices, each memory device having a plurality of memory pages including a plurality of memory locations, each memory location having an address; where pixel data for each pixel corresponds to an entry in one of a plurality of swapped pixel pages, each swapped pixel page having a plurality of pixel page rows each including a plurality of pixels and a plurality of pixel page columns each including a plurality of pixels, where pixel data is stored to the memory devices in the first order and retrieved from the memory devices in the second order, and where each memory page stores pixel data in multiple locations according to the first order and stores pixel data in multiple locations according to the second order, and where pixel data is retrieved in parallel for two pixels from different portions of the frame of pixels.

33 Claims, 20 Drawing Sheets

U.S. PATENT DOCUMENTS

| | | | |
|---|---|---|---|
| 5,268,682 | A | 12/1993 | Yang et al. |
| 5,303,341 | A | 4/1994 | Rivshin |
| 5,479,605 | A | 12/1995 | Saitoh |
| 5,559,953 | A | 9/1996 | Seiler et al. |
| 5,561,777 | A | 10/1996 | Kao et al. |
| 5,579,473 | A | 11/1996 | Schlapp et al. |
| 5,606,650 | A | 2/1997 | Kelley et al. |
| 5,619,471 | A | 4/1997 | Nunziata |
| 5,633,726 | A | 5/1997 | Timmermans |
| 5,668,568 | A | 9/1997 | Holloman |
| 5,781,201 | A | 7/1998 | McCormack et al. |
| 5,794,016 | A | 8/1998 | Kelleher |
| 5,798,843 | A | 8/1998 | Yamamoto |
| 5,815,167 | A | 9/1998 | Muthal et al. |
| 5,815,169 | A | 9/1998 | Oda |
| 5,831,926 | A | 11/1998 | Norris et al. |
| 5,835,952 | A | 11/1998 | Yamauchi |
| 5,924,111 | A | 7/1999 | Huang et al. |
| 5,933,154 | A | 8/1999 | Howard et al. |
| 6,005,592 | A | 12/1999 | Koizumi et al. |
| 6,018,354 | A | 1/2000 | Jones et al. |
| 6,023,745 | A | 2/2000 | Lu |
| 6,031,638 | A | 2/2000 | Rao et al. |
| 6,111,992 | A | 8/2000 | Likhterov et al. |
| 6,150,679 | A | 11/2000 | Reynolds |
| 6,177,922 | B1 | 1/2001 | Schiefer et al. |
| 6,226,709 | B1 | 5/2001 | Goodwin et al. |
| 6,259,459 | B1 | 7/2001 | Middleton |
| 6,278,645 | B1 | 8/2001 | Buckelew et al. |
| 6,282,603 | B1 | 8/2001 | Rao |
| 6,301,649 | B1 | 10/2001 | Takasugi |
| 6,331,854 | B1 | 12/2001 | Rogers et al. |
| 6,347,344 | B1 | 2/2002 | Baker et al. |
| 6,417,867 | B1 | 7/2002 | Hallberg |
| 6,480,428 | B1 | 11/2002 | Zheng |
| 6,496,192 | B1 | 12/2002 | Shreesha et al. |
| 6,519,673 | B1 | 2/2003 | Chudnovsky |
| 6,549,207 | B1 | 4/2003 | Matsumoto |
| 6,567,531 | B1 | 5/2003 | Kondo et al. |
| 6,587,112 | B1 | 7/2003 | Goeltzenleuchter et al. |
| 6,665,749 | B1 | 12/2003 | Ansari |
| 6,724,396 | B1 | 4/2004 | Emmot et al. |
| 6,765,579 | B1 | 7/2004 | Champion |
| 6,765,580 | B1 | 7/2004 | Champion |
| 6,768,490 | B1 | 7/2004 | Champion |
| 2002/0109689 | A1 | 8/2002 | Champion |
| 2002/0109690 | A1 | 8/2002 | Champion |
| 2002/0109691 | A1 | 8/2002 | Champion |
| 2002/0109692 | A1 | 8/2002 | Champion |
| 2002/0109693 | A1 | 8/2002 | Champion |
| 2002/0109694 | A1 | 8/2002 | Champion |
| 2002/0109695 | A1 | 8/2002 | Champion |
| 2002/0109696 | A1 | 8/2002 | Champion |
| 2002/0109698 | A1 | 8/2002 | Champion |
| 2002/0109791 | A1 | 8/2002 | Champion |
| 2002/0109792 | A1 | 8/2002 | Champion |
| 2002/0110030 | A1 | 8/2002 | Champion |
| 2002/0110351 | A1 | 8/2002 | Champion |
| 2002/0113904 | A1 | 8/2002 | Champion |
| 2003/0058368 | A1 | 3/2003 | Champion |
| 2003/0151609 | A1 | 8/2003 | Champion |
| 2005/0024368 | A1 | 2/2005 | Champion |

OTHER PUBLICATIONS

Corrigan, R.W. et al; "An Alternative Architecture for High Performance Display," Presented at the 141st SMPTE Technical Conference and Exhibition; Nov. 20, 1999, New York, New York pp 1–5, Silicon Machines, Sunnyvale, California.

Hearn, D. et al; Computer Graphics C Version [2nd Ed] pp 53–56; Prentice Hall, Upper Saddle River, New Jersey.

McCarron, D. et al; "Accelerating PC Graphics; Emerging Technologies Edition," Market Strategy and Forecase Report; 1995, pp 2–49 thorugh 2–93, 2–159 (labeled as pp 1–46); Mercury Research.

Lieberman, David; "Sony champions MEMS display technology;" EE Times, Jul. 14, 2000; http://www.eetimes.com/story/OEG20000714S0004.

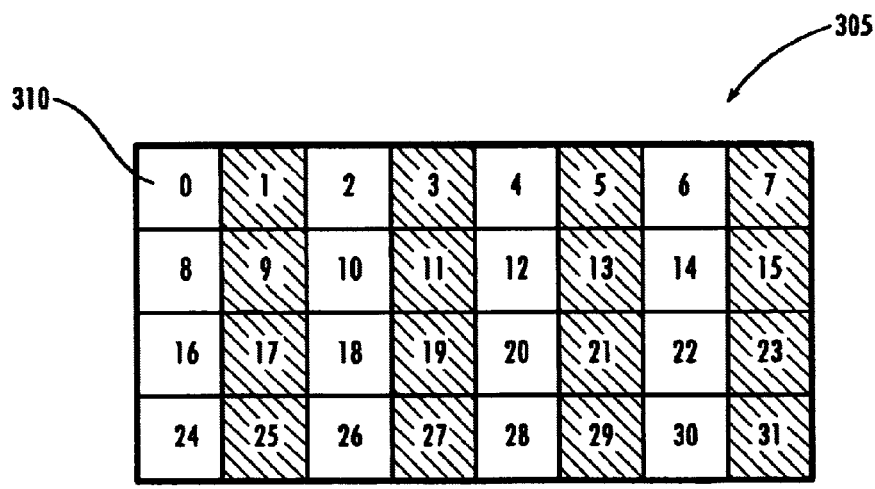
Fig. 3A
(Prior Art)
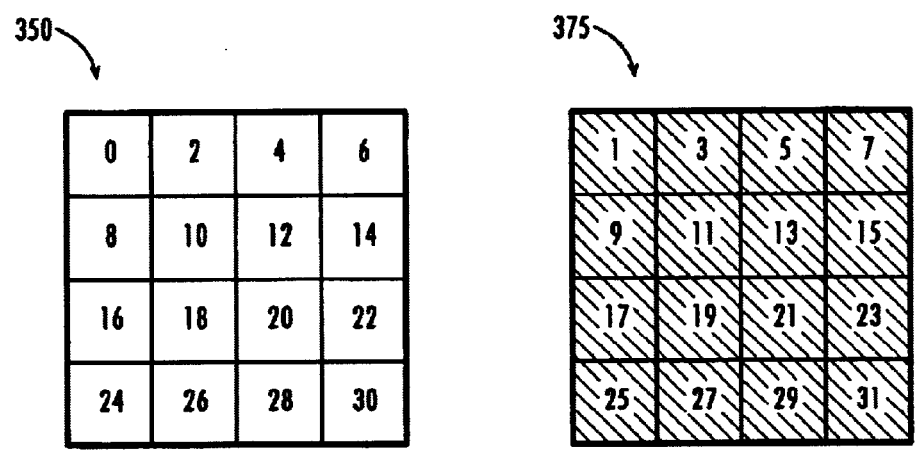
Fig. 3B
(Prior Art)
Fig. 3C
(Prior Art)

| PIXEL | FRAME ROW | FRAME COLUMN | PIXEL PAGE | PIXEL PAGE ROW | PIXEL PAGE COLUMN | MEMORY PAGE | MEMORY ADDRESS | MEMORY DEVICE |
|---|---|---|---|---|---|---|---|---|
| 0 | 0 | 0 | 0 | 0 | 0 | 0 | 0 | 0 |
| 1 | 0 | 1 | 0 | 0 | 1 | 0 | 0 | 1 |
| 31 | 0 | 31 | 0 | 0 | 31 | 0 | 15 | 1 |
| 32 | 0 | 32 | 1 | 0 | 0 | 1 | 256 | 0 |
| 1919 | 0 | 1919 | 59 | 0 | 31 | 59 | 15119 | 1 |
| 1920 | 1 | 0 | 0 | 1 | 0 | 0 | 16 | 0 |
| 28800 | 15 | 0 | 0 | 15 | 0 | 0 | 240 | 0 |
| 30719 | 15 | 1919 | 59 | 15 | 31 | 59 | 15359 | 1 |
| 30720 | 16 | 0 | 60 | 0 | 0 | 60 | 15360 | 0 |
| 1044480 | 544 | 0 | 2040 | 0 | 0 | 2048 | 524288 | 1 |
| 1044481 | 544 | 1 | 2040 | 0 | 1 | 2048 | 524288 | 0 |
| 1044512 | 544 | 32 | 2041 | 0 | 0 | 2049 | 524544 | 1 |
| 2073599 | 1079 | 1919 | 4079 | 7 | 31 | 4087 | 1046399 | 0 |
| XXX | XXX | XXX | 4079 | 15 | 31 | 4087 | 1046527 | 0 |

Fig. 14

SWAPPED PIXEL PAGES

RELATED APPLICATIONS

This application is a Continuation of U.S. application Ser. No. 10/077,131, entitled SWAPPED PIXEL PAGES, filed Feb. 15, 2002, now U.S. Pat. No. 6,850,241 which claims the benefit of U.S. Provisional Application No. 60/269,784 filed Feb. 15, 2001, of U.S. Provisional Application No. 60/269,783 filed Feb. 15, 2001, and of U.S. Provisional Application No. 60/324,498 filed Sep. 24, 2001, the disclosures of all of which are incorporated herein by reference.

This application is related to the following co-pending and commonly assigned patent applications: U.S. application Ser. No. 10/051,538, filed Jan. 16, 2002; U.S. application Ser. No. 10/051,680, filed Jan. 16, 2002; U.S. application Ser. No. 10/052,074, filed Jan. 16, 2002; and U.S. application Ser. No. 10/051,541, filed Jan. 16, 2002, the disclosures of which are incorporated herein by reference.

BACKGROUND

The present invention is related to video data storage. More particularly, the present invention is related to video display systems and frame buffers. Several related technologies are discussed below (in labeled sections for clarity).

1. Raster Scan Displays

A common type of graphics monitor is a conventional raster-scan display using a cathode ray tube ("CRT"). As is well known, in a typical CRT, an electron beam strikes phosphor on the inner surface of the screen producing light visible on the outer surface of the screen. By controlling the electron beam different locations of the screen can be struck, creating a pattern and hence a video image. In a typical CRT raster-scan display, the screen area is divided into a grid of pixels (or picture elements). The electron beam sweeps from left to right across the screen, one row at a time from top to bottom, progressively drawing each pixel on the screen. Each row of pixels is commonly referred to as a scan line. In this type of conventional display, the scan lines are horizontal. The number of pixels in a single scan line is referred to as the width. One complete pass over the screen and the pixels in that pass are commonly referred to as a frame. As the electron beam moves across the pixels of each scan line, the beam intensity can be adjusted to vary the light produced by the screen phosphor corresponding to the pixels. The light emitted by the phosphor of the pixels creates a pattern of illuminated spots forming the video image. The intensity of the electron beam is controlled by image data stored in a section of memory called the frame buffer or refresh buffer.

2. Grating Light Valves

Another type of display system uses one or more grating light valves ("GLV") to produce an image. GLV's are known devices, and a description can be found in (among other sources) a paper by D. M. Bloom of Silicon Light Machines, Inc., titled "The Grating Light Valve: revolutionizing display technology" (1997; available from Silicon Light Machines; and a copy of which has been filed in an Information Disclosure Statement for this application), and in an article (and therein cited references) by R. W. Corrigan and others of Silicon Light Machines, Inc., titled "An Alternative Architecture for High Performance Display" (presented at the 131$^{st}$ SMPTE Technical Conference and Exhibition, Nov. 20, 1999, in New York, N.Y.), the disclosures of which are incorporated herein by reference. In overview, a GLV uses a combination of reflection and diffraction of light to create an image. A GLV includes a one-dimensional array of GLV pixels, each GLV pixel including a number of microscopic "ribbons." The ribbons for each GLV pixel can be deflected through electrostatic force to create an adjustable diffraction grating. In a non-deflected state, the ribbons reflect light. As the ribbons are deflected, the ribbons increasingly diffract light. Accordingly, by controlling the ribbons, the proportion of light that is either reflected or diffracted can be controlled for each GLV pixel. The GLV deflects the ribbons for each GLV pixel according to image data, such as pixel data received from a frame buffer.

An array of GLV pixels can create a column of visible pixels, such as 1088 pixels, typically an entire column at a time. A GLV can be used to create a vertical column of pixels in a high definition resolution image, such as a screen resolution of 1920 pixels horizontally by 1080 pixels vertically (with some of the 1088 pixels left blank or dark). By providing a GLV with pixel data representing columns of pixels in a frame, the GLV can create the frame of pixels, one column at a time, sweeping from left to right. The location of each column of pixels can be controlled external to the GLV array, such as through lenses and an adjustable mirror, rather than moving the GLV itself. A combination of three GLV's for red, green, and blue can be used to produce a color image.

3. Frame Buffers

FIG. 1A is a representation of a screen 105 as a grid of pixels 110. In FIG. 1A, for simplicity, screen 105 is only 4×4 and so only 16 pixels are shown, but a typical screen has many more pixels. One common screen resolution is high definition ("HD") resolution, where screen resolution indicates the number of pixels in a frame and is typically given as the horizontal resolution (number of pixels in one row) versus the vertical resolution (number of pixels in one column). HD resolution is either 1920×1080 (2,073,600 total pixels per frame) or 1280×720 (921,600 pixels per frame). Herein, HD resolution refers to 1920×1080.

Returning to FIG. 1A, the pixels 110 are often numbered sequentially for reference. Pixel 0 is typically at the upper left. FIG. 1B is a representation of a memory device 150 implementing a frame buffer as a grid of memory locations 155. Typical memory devices include SDRAM (synchronous dynamic random access memory). The actual memory device used may vary in different devices, but the memory locations for the frame buffer are typically in a contiguous block of locations with sequential addresses. Memory device 150 has a memory location 155 for storing pixel data (e.g., an intensity value) for each pixel 110 of screen 105. In some implementations, pixel data for more than one pixel is stored at each memory location. In many conventional rasterscan systems, pixel data is stored in memory locations adjacent to one another in the same pattern as the pixels on the screen. In FIG. 1B, each memory location 155 is numbered with the number of the pixel (110 from FIG. 1A) corresponding to the pixel data stored in that memory location 155. For example, the pixel at the upper left of the screen is pixel 0 in FIG. 1A and pixel data for pixel 0 is stored in the first memory location in memory device 150, as indicated by the "0" in the upper left memory location 155. The second memory location stores pixel data for pixel 1, the fifth memory location stores pixel data for pixel 4, and so on.

4. Pixel Rates

FIG. 2 is a representation of screen resolutions and typical data throughput requirements. FIG. 2 shows four resolutions in respective areas: VGA resolution (640×480) 205, XGA resolution (1024×768) 210, SXGA resolution (1280×1024) 215, and HD resolution (1920×1080) 220. The pixel rate for a screen resolution is the number of pixels per second that need to be processed to maintain the screen resolution at a specified refresh rate (i.e., the number of times a complete frame is drawn to the screen per second). While pixel rates vary among implementations, the pixel rates shown in FIG. 2 are representative. These pixel rates are given in megapixels per second ("MP/S"). For example, according to SMPTE 274M-1998 (a specification defining, among other things, pixel rates for resolutions of 1920×1080), for HD resolution 220 the pixel rate is about 150 MP/S @ 60 Hz. FIG. 2 also shows a corresponding approximate data rate in megabytes per second ("MB/S") for each resolution. The data rate is the number of bytes per second to be processed based on the number of bytes per pixel and the pixel rate. For example, HD resolution 220 has a data rate of 450 MB/S, at 24 bits per pixel (3 bytes). If each pixel has 32 bits of data, the data rate for HD resolution is 600 MB/S. However, the data rate of a typical 32-bit wide SDRAM running at 125 MHz is approximately 500 MB/S. A frame buffer architecture using two 125 MHz SDRAM's can realize a data rate of approximately 1000 MB/S. Alternatively, a faster SDRAM, such as one running at 150 MHz, can meet 600 MB/S.

5. Frame Buffers Using Parallel Storage in Two Memory Devices

FIG. 3A is a representation of a frame 305 of pixels 310 divided between two memory devices. Frame 305 has only 32 pixels for simplicity, but, as noted above, a typical HD resolution frame has 2,073,600 pixels. FIG. 3B is a representation of a first memory device 350 and FIG. 3C is a representation of a second memory device 375. Each pixel 310 in frame 305 is numbered, starting with pixel 0 in the upper left of frame 305. Even-numbered pixels are stored in first memory device 350 and odd-numbered pixels are stored in second memory device 375. The pixels stored in second memory device 375 are also shaded for clarity in FIGS. 3A and 3C.

FIG. 4 is a block diagram of a typical frame buffer architecture 400 capable of accessing pixel data for two pixels in parallel, supporting the representations shown in FIGS. 3A, 3B, and 3C. For example, frame buffer architecture 400 can be used in a typical scan converter. A video source 405 provides pixel data to a first memory 410 (recall first memory device 350 in FIG. 3B) and to a second memory 415 (recall second memory device 375 in FIG. 3C) in parallel and a video destination 420 retrieves pixel data from first memory 410 and from second memory 415 in parallel. In this implementation, pixel data for each pixel is stored in a separate addressable memory location. Video source 405 receives video data from another source (not shown), such as a broadcast source or a software application running on a computer system connected to video source 405. Video destination 420 controls the display of each pixel on a video device (not shown), such as a CRT. First memory 410 and second memory 415 are separate memory devices such as two SDRAM's. A first data bus 425 is connected to video source 405, first memory 410, and video destination 420. A second data bus 430 is connected to video source 405, second memory 415, and video destination 420. A source address bus 435 is connected to video source 405 and a first input 440 of an address multiplexor 445. A destination address bus 450 is connected to video destination 420 and a second input 455 of address multiplexor 445. An output 460 of address multiplexor 445 is connected to first memory 410 and second memory 415. Accordingly, the same address is provided to both first memory 410 and second memory 415. Address multiplexor 445 receives a control signal (not shown) to cause first input 440 or second input 455 to connect to output 460. First memory 410 and second memory 415 also receive control signals (not shown) to control whether memories 410 and 415 will read in data (write mode) or read out data (read mode). In addition, while clock lines are not shown in FIG. 4, architecture 400 operates based on clock cycles so that pixel data can be processed for two pixels per clock cycle in support of the desired pixel rate.

In operation, memories 410 and 415 read in or store complementary halves of a frame of pixels as pixel data from video source 405 and output the pixel data to video destination 420. To store pixel data, memories 410 and 415 are put in write mode and address multiplexor 445 is set to connect first input 440 to output 460. Video source 405 provides pixel data for a first pixel to first data bus 425, such as pixel 0 in FIG. 3A, and pixel data for a second pixel to second data bus 430, such as pixel 1 in FIG. 3A. First data bus 425 provides its pixel data to first memory 410 and second data bus 430 provides its pixel data to second memory 415. Video source 405 also provides an address to source address bus 435. To calculate the address, video source 405 can use a counter. Because each memory 410 and 415 stores pixel data for half the pixels in one frame, the counter typically ranges from 0 to one less than one-half of the number of pixels in one frame. Video source 405 can increment the counter by 1 for each pixel pair. Source address bus 435 provides the address to first input 440 of address multiplexor 445. Address multiplexor 445 in turn provides the address to first memory 410 and second memory 415. First memory 410 stores the pixel data on first data bus 425 at the address supplied by address multiplexor 445 from video source 405. Second memory 415 stores the pixel data on second data bus 430 at the same address. Two pixels have been stored in parallel in two memories using the same address. Referring to FIGS. 3A, 3B, and 3C, pixel 0 and pixel 1 are stored at the same time at the same address in first memory device 350 and second memory device 375, respectively. Accordingly, for example, pixel 0 is at address 0 in first memory device 350, pixel 1 is at address 0 in second memory device 375, pixel 2 is at address 1 in first memory device 350, pixel 3 is at address 1 in second memory device 375, and so on.

To retrieve pixel data, memories 410 and 415 are put in read mode and address multiplexor 445 is set to connect second input 455 to output 460. Video destination 420 provides an address to destination address bus 450. Destination address bus 450 provides the address to second input 455 of address multiplexor 445. Address multiplexor 445 in turn provides the address to first memory 410 and second memory 415. First memory 410 provides the pixel data stored at the address supplied by address multiplexor 445 from video destination 415 to first data bus 425. Second memory 415 provides the pixel data stored at the same address to second data bus 430. First data bus 425 provides its pixel data to video destination 420 and second data bus 430 provides its pixel data to video destination 420. Two pixels have been retrieved in parallel from two memories using the same address. Referring to FIGS. 3A, 3B, and 3C, pixel 0 and pixel 1 can be retrieved at the same time using the same address from first memory device 350 and second memory device 375, respectively.

FIG. 5 is a block diagram of another implementation of a dual pixel frame buffer architecture 500. Architecture 500 is similar to architecture 400 of FIG. 4, but a memory controller 545 provides data and addresses to memories 510 and 515. Memory controller 545 receives pixel data from video source 505 to store in memories 510 and 515. Memory controller 545 retrieves pixel data from memories 510 and 515 and provides the pixel data to video destination 520. Memory controller 545 replaces address multiplexor 445. Memory controller 545 receives signals from video source 505 and video destination 520 indicating whether pixel data is to be stored to or retrieved from memories 510 and 515. Memory controller 545 generates addresses and supplies these addresses along with control signals to memories 510 and 515. Accordingly, memory controller 545 controls address generation rather than video source 505 and video destination 520, as compared with architecture 400 of FIG. 4. In addition, as noted above with respect to FIG. 4, architecture 500 operates based on clock cycles so that pixel data can be processed for two pixels per clock cycle in support of the desired pixel rate.

6. Double-Buffering

Typical frame buffer architectures often also utilize "double-buffering." Double-buffering is a well known technique where the memory address space of a frame buffer is divided into two sections. In some architectures, each section is a separate memory device, and in other architectures one or more devices are each divided into sections. Data from a frame is stored in one section while data from a previously stored frame is read from the other section. Series of reading and writing operations alternate. For example, after storing pixel data for 16 pixels, pixel data for 16 pixels is retrieved. After storing a frame, the sections switch roles. Pixel data for blocks of pixels can be temporarily stored before being sent to memory or after being received from memory in a buffer, such as a FIFO buffer. In architectures 400 and 500 from FIGS. 4 and 5, respectively, FIFO buffers can be included in both the video source and the video destination, or in the memory controller.

7. SDRAM

Various types of memory devices can be used in implementing a frame buffer. One common type of memory used is SDRAM (synchronous dynamic random access memory). The structure and operation of SDRAM is well known. In overview, an SDRAM has a number of addressable memory locations that depends on the total size of the SDRAM and the size of each memory location. Each addressable memory location has a corresponding memory address. For example, an 8 MB (megabyte) SDRAM where each location is 32 bits has 2,097,152 addressable locations, while an 8 MB SDRAM were each location is 8 bits has four times as many addressable locations. FIG. 6A is a representation of 2,097,152 memory locations as a one-dimensional array 605. Memory cells in a typical SDRAM are physically arranged in a two-dimensional grid and so individual cells can be identified using a combination of a row number and a column number. The memory locations within the same row are often collectively referred to as a "page." FIG. 6B is a representation of 2,097,152 memory locations as a two-dimensional array or grid 650 having X columns and Y rows. In FIG. 6B, grid 650 has 256 columns 655, from 0 to X−1, and 8192 rows or pages 660, from 0 to Y−1. Accordingly, the location in row y at column x has address (y*X+x). For example, location 665 (the first location in the last page) has address (X*(Y−1)) and location 670 (the last location in the last page) has address (X*Y−1). The sizes of the boxes representing locations in FIG. 6C are representative and not to scale, so different size boxes are not different size memory locations (e.g., locations 665 and 670).

An address for a memory cell can be viewed as a combination of a row address and a column address. FIG. 6C is a representation of an address 675 for one memory location out of 2,097,152. Address 675 has 21 bits, with A0 as the lowest order bit. The lower 8 bits, A0 to A7, are a column address 680, ranging from 0 to 255. The upper 13 bits, A8 to A20, are a row or page address 685, ranging from 0 to 8191.

Due to the nature of the construction of SDRAM, an entire page of memory cells is active at a time. Accessing cells within the same page can be accomplished relatively quickly using a series of column addresses without changing the page address. To change pages, a new page address is used and an additional delay is incurred from both the extra address cycle and a delay in the memory changing which page is active. This delay is referred to as a "page miss" and can result in a loss in speed. SRAM (static random access memory) typically does not incur the same page miss delay as SDRAM, but SRAM is typically more expensive than SDRAM.

In a conventional frame buffer using SDRAM, pixel data for horizontally neighboring pixels is typically stored in the same page of memory. Referring to FIGS. 1A and 1B, pixel data for pixels 0, 1, 2, and 3 would be stored in one page, pixel data for pixels 4, 5, 6, and 7 would be stored in another page, and so on. In a parallel architecture, such as architecture 400 in FIG. 4, a page stores pixel data for every other horizontally aligned pixel, such as the first page of memory device 350 storing pixel data for pixels 0, 2, 4, and 6 in FIGS. 3A and 3B. Storing and retrieving pixel data can be accomplished quickly with few page misses because pixel data in a conventional raster scan system is processed in row order (left to right, top to bottom) for both storing and retrieving. The pixel data for pixels in different rows are typically not stored in the same page, and so page misses occur when pixel data is to be stored or retrieved for pixels from different rows. For example, retrieving pixel data for pixels 0, 1, 2, and 3 would cause one page miss (the initial page miss in the first access), but retrieving pixel data for pixels 0, 4, 8, and 12 would cause four page misses.

SUMMARY

The present disclosure provides methods and apparatus for implementing a pixel page system providing swapped pixel pages for use with a GLV (grating light valve). In one implementation, a swapped pixel page system includes: a data source, providing pixel data for pixels in a first order, where each pixel is in a frame of pixels, the frame having horizontal rows of pixels, vertical columns of pixels, a first portion and a second portion; a data destination, receiving pixel data for pixels in a second order; and at least two memory devices, each memory device having a plurality of memory pages including a plurality of memory locations, each memory location having an address; where pixel data for each pixel corresponds to an entry in one of a plurality of swapped pixel pages, each swapped pixel page having a plurality of pixel page rows each including a plurality of pixels and a plurality of pixel page columns each including a plurality of pixels, where pixel data is stored to the memory devices in the first order and retrieved from the memory devices in the second order, and where each memory page stores pixel data in multiple locations according to the first order and stores pixel data in multiple locations according to the second order, and where pixel data is retrieved in parallel for two pixels from different portions of the frame of pixels.

In another implementation, a method of storing pixel data includes: storing pixel data for a first pixel and a second pixel in parallel in a first memory and a second memory, respectively, where the first pixel and the second pixel are pixels in a frame of pixels, where the frame includes multiple horizontal rows of pixels and multiple vertical columns of pixels, and where the first pixel is the leftmost pixel in the first horizontal row of pixels in a first portion of the frame and the second pixel is horizontally adjacent to the first pixel; and storing pixel data for a third pixel and a fourth pixel in parallel in the second memory and the first memory, respectively, where the third pixel is the leftmost pixel in the first horizontal row of pixels in a second portion of the frame and is in the same vertical column of pixels as the first pixel, and the fourth pixel is horizontally adjacent to the third pixel.

In another implementation, a method of retrieving pixel data includes: retrieving pixel data for a first pixel and a second pixel in parallel from a first memory and a second memory, respectively, where the first pixel and the second pixel are pixels in a frame of pixels, where the frame includes multiple horizontal rows of pixels and multiple vertical columns of pixels, and where the first pixel is the topmost pixel in a first portion of the first vertical column of pixels in the frame and the second pixel is the topmost pixel in a second portion of the first vertical column of pixels; and retrieving pixel data for a third pixel and a fourth pixel in parallel from the second memory and the first memory, respectively, where the third pixel is the topmost pixel in the first portion of the second vertical column of pixels in the frame and is horizontally adjacent to the first pixel, and the fourth pixel is the topmost pixel in the second portion of the second vertical column of pixels.

BRIEF DESCRIPTION OF THE DRAWINGS

FIG. 3A is a representation of a frame of pixels divided between two memory devices.

FIG. 3B is a representation of a first memory device.

FIG. 3C is a representation of a second memory device.

FIG. 10 is a representation of a frame of pixels using swapped pixel pages according to the present invention.

FIG. 14 is a table showing the relationships among a pixel, a frame row, a frame column, a swapped pixel page, a pixel page row, a pixel page column, a memory page, a memory address, and a memory device for an HD resolution implementation (1920×1080) using swapped pixel pages according to the present invention.

FIG. 17 is a flowchart of retrieving pixel data according to the present invention.

DETAILED DESCRIPTION

Figure 1A:
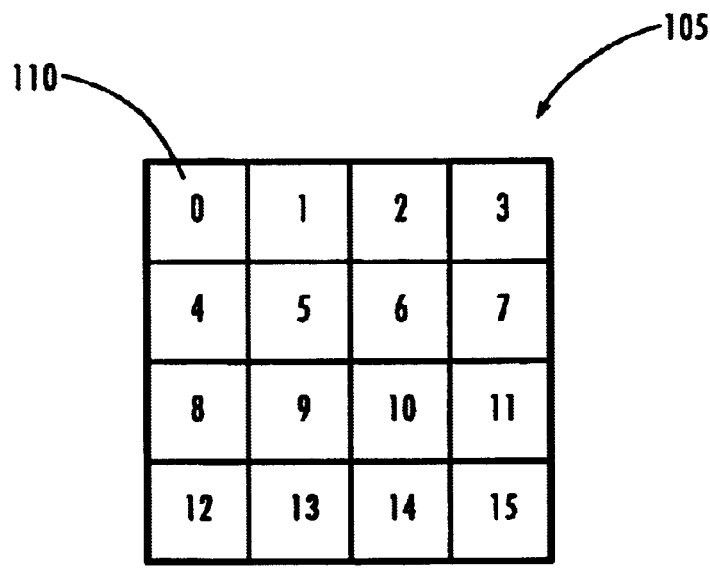
FIG. 1A is a representation of a screen as a grid of pixels.
Figure 1B:
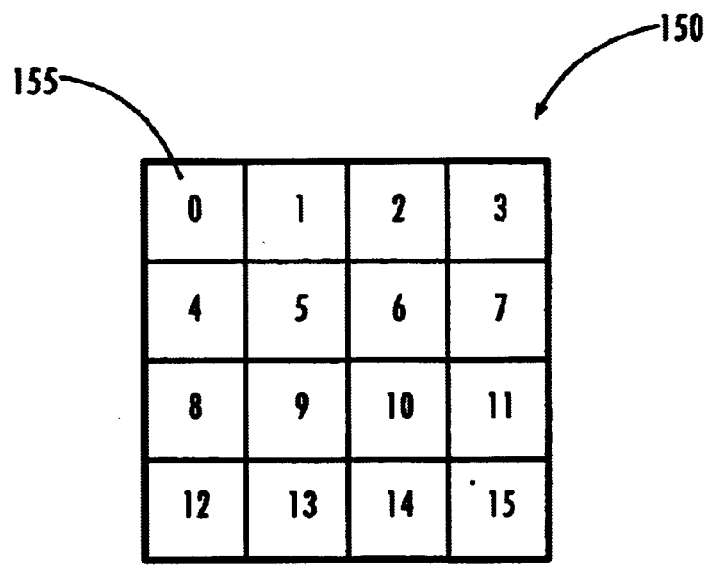
FIG. 1B is a representation of a memory device implementing a frame buffer as a grid of memory locations.
Figure 2:
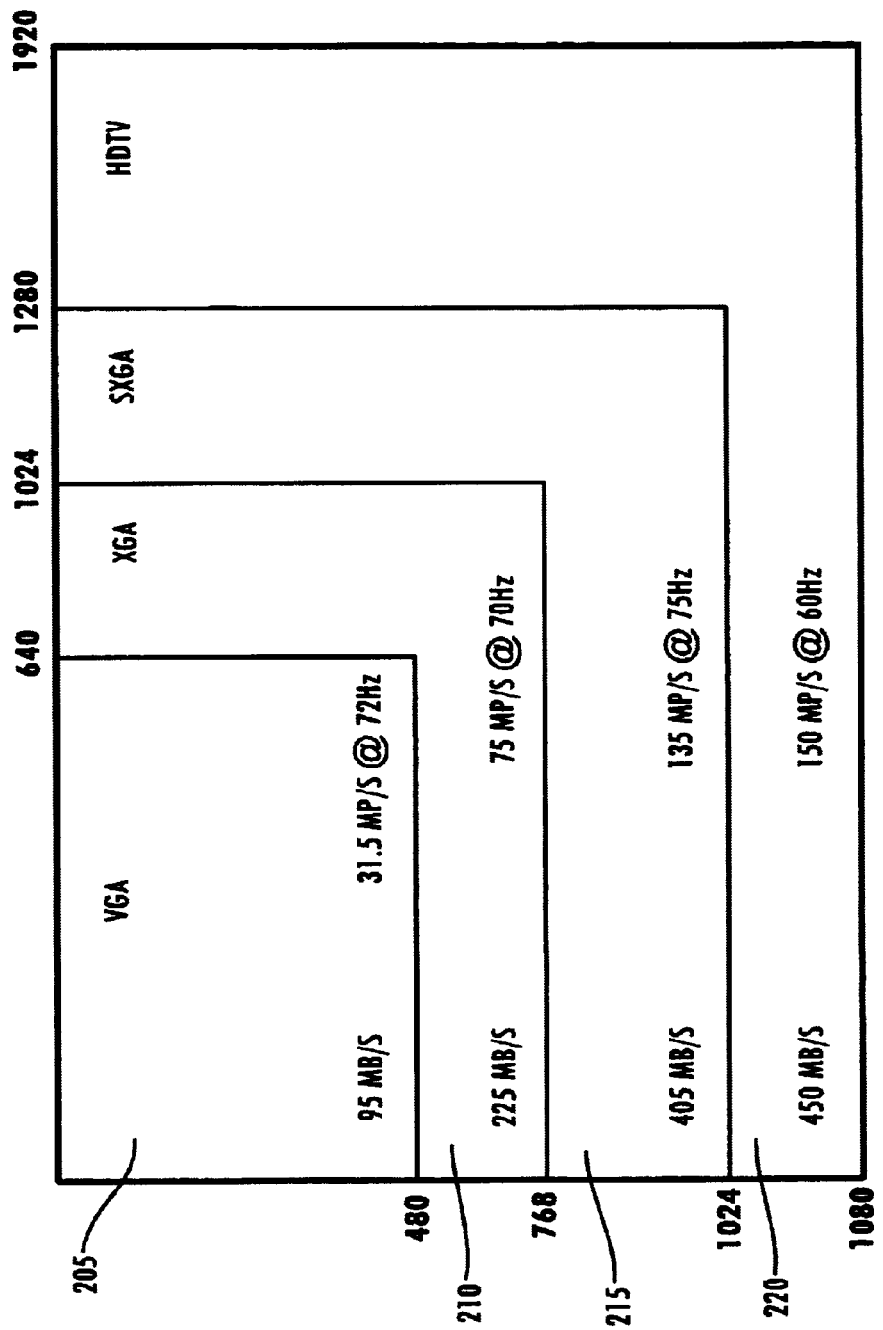
FIG. 2 is a representation of screen resolutions and typical data throughput requirements.

The present invention provides methods and apparatus for implementing a pixel page system providing swapped pixel pages for use with a GLV (grating light valve). As described above, a GLV projects an image using a horizontal scan (one column of pixels at a time, sweeping from left to right). Accordingly, it is advantageous to provide pixel data to a GLV according to vertical columns of pixels in a frame. One implementation of a GLV receives pixel data in two streams: one for one portion (e.g., the upper half) of a frame of pixels and one for another portion (e.g., the lower half) of the frame. In one embodiment, each portion of the frame includes multiple horizontal rows of pixels and at least a portion of multiple vertical columns of pixels. Swapped pixel pages provide parallel retrieval of pixel data from the upper and lower halves of a frame of pixel. Accordingly, swapped pixel pages can be used to provide two parallel pixel data streams to a GLV.

As described in the related U.S. application Ser. No. 10/051,538, filed Jan. 16, 2002, a pixel page is a two-dimensional array of pixels. A pixel page maps pixel data to memory locations for a region of pixels from multiple rows and columns of pixels in a frame. The memory locations within a memory device corresponding to one pixel page are in the same physical memory page. Pixel data is stored according to horizontal rows of pixels and retrieved according to vertical columns of pixels. A swapped pixel page is a type of pixel page where swapped pixel pages in the upper half of a frame of pixels indicate pixel data is stored according to one mapping to memory devices while swapped pixel pages in the lower half of the frame indicate a different mapping, reversing the mapping in the upper half of the frame.

A. Swapped Pixel Pages

In implementations using video data and swapped pixel pages, the swapped pixel pages are used in a frame buffer for storing pixel data. Pixel data is supplied to the frame buffer according to the horizontal order of pixels in a frame, such as from left to right, top to bottom. Pixel data is provided by the frame buffer according to the vertical order of pixels in a frame for the upper and lower halves of the frame in parallel, such as from top to bottom, left to right. Swapped pixel pages are configured to support storing and retrieving pixel data in these two different orders.

Each swapped pixel page is a two-dimensional mapping of pixels and pixel data to memory locations, aligning rows and columns within the swapped pixel page with rows and columns in the frame of pixels. One dimension of the swapped pixel page, referred to as pixel page rows, corresponds to horizontal rows of pixels in the frame, referred to as frame rows. A second dimension of the swapped pixel page, referred to as pixel page columns, corresponds to vertical columns of pixels in the frame, referred to as frame columns. A swapped pixel page has multiple pixel page rows and multiple pixel page columns. Each swapped pixel page indicates memory locations from a single physical memory page within each corresponding memory device so that consecutive accesses to locations from a single pixel page do not cause page misses. Accordingly, accessing consecutive locations corresponding to a swapped pixel page along a pixel page row or along a pixel page column do not cause page misses. Page misses can occur at the end of a pixel page row or pixel page column in making a transition to another swapped pixel page. By storing pixel data along pixel page rows and retrieving data along pixel page columns, page misses can be reduced in processing pixel data that is to be stored in one order and retrieved in another order.

Figure 7:
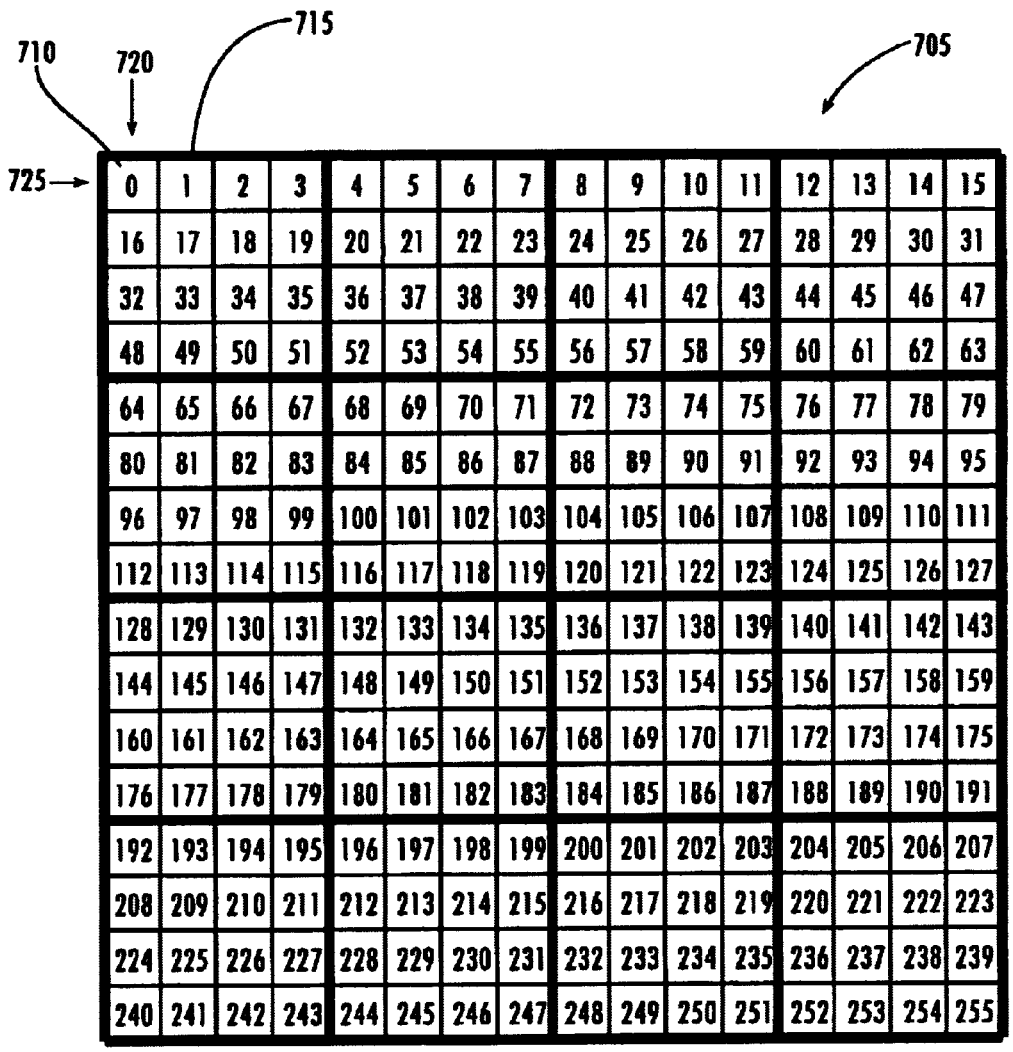
FIG. 7 is a representation of a frame of pixels according to the present invention.

FIG. 7 is a representation of a frame 705 of pixels 710 divided into pixel pages 715. FIG. 7 (and FIG. 8 below) illustrates pixel pages 715 as an introduction to swapped pixel pages. Frame 705 has 16 frame columns and 16 frame rows (16×16; 256 pixels) for simplicity, but other resolutions are possible. For example, as noted above, a frame in one typical HD resolution is 1920×1080 (2,073,600 pixels). Pixels 710 in frame 705 are sequentially numbered from 0 to 255. Frame 705 is divided into pixel pages 715, outlined in heavier lines. Each pixel page 715 includes 16 pixels 710 and has a pixel page geometry of 4×4, four pixel page columns 720 and four pixel page rows 725. Accordingly, a pixel page column 720 includes four pixels 710, and a pixel page row 725 includes four pixels 710. For example, pixels 0, 16, 32, and 48 are in one pixel page column 720 and pixels 0, 1, 2, and 3 are in one pixel page row 725. Frame 705 has 16 pixel pages 715, four horizontally by four vertically. Pixel data for each pixel page 715 is stored in a respective page of physical memory. For frame 705, the first page of memory stores pixel data for the pixel page 715 including pixels 0, 1, 2, 3, 16, 17, 18, 19, 32, 33, 34, 35, 48, 49, 50, and 51. The second page of memory stores pixel data for the pixel page 715 including pixels 4, 5, 6, 7, 20, 21, 22, 23, 36, 37, 38, 39, 52, 53, 54, 55, and so on.

In storing pixel data for frame 705, pixel data is stored for pixels 710 in horizontal row order (left to right, top to bottom): 0, 1, 2, 3, 4, and so on. Pixel data is stored following the pixel page rows 725 of pixel pages 715 (e.g., horizontally). A page miss occurs at the boundary of each pixel page 715, at the end of a pixel page row 725 (some page misses can be hidden using burst accessing or a burst mode, depending on the type of memory device). Because pixel pages 715 are four pixels 710 wide, a page miss would occur storing pixel data for every four pixels 710, i.e., storing pixel data for pixel 0, for pixel 4, pixel 8, etc. Storing one frame 705 of pixel data would cause a total of 64 page misses (4*16).

In retrieving pixel data for frame 705, pixel data is retrieved for pixels 710 in vertical column order (top to bottom, left to right): 0, 16, 32, 48, 64, and so on. Pixel data is retrieved following the pixel page columns 720 of the pixel pages 715 (e.g., vertically). A page miss occurs at the end of each pixel page column 720. Because pixel pages 715 are four pixels 710 tall, a boundary of a pixel page 715 occurs vertically every four pixels 710. Accordingly, a page miss would occur retrieving pixel data for every four pixels 710, i.e., retrieving pixel data for pixel 0, for pixel 64, for pixel 128, etc. Retrieving one frame 705 of pixel data would cause a total of 64 page misses (4*16).

The total page misses in processing one frame 705 using pixel pages 715 would be 128. By comparison, if pixel data were stored corresponding to horizontal frame rows of pixels, i.e., pixel data for pixels 0 through 15 were stored in the same memory page, a page miss would occur every 16 pixels for storing pixel data and every pixel for retrieving pixel data. Storing one frame would cause 16 page misses (1*16) and retrieving one frame would case 256 page misses (16*16). The total page misses in processing one frame would be 272. Accordingly, pixel pages can provide a significant speed improvement without changing the physical memory device.

Figure 8:
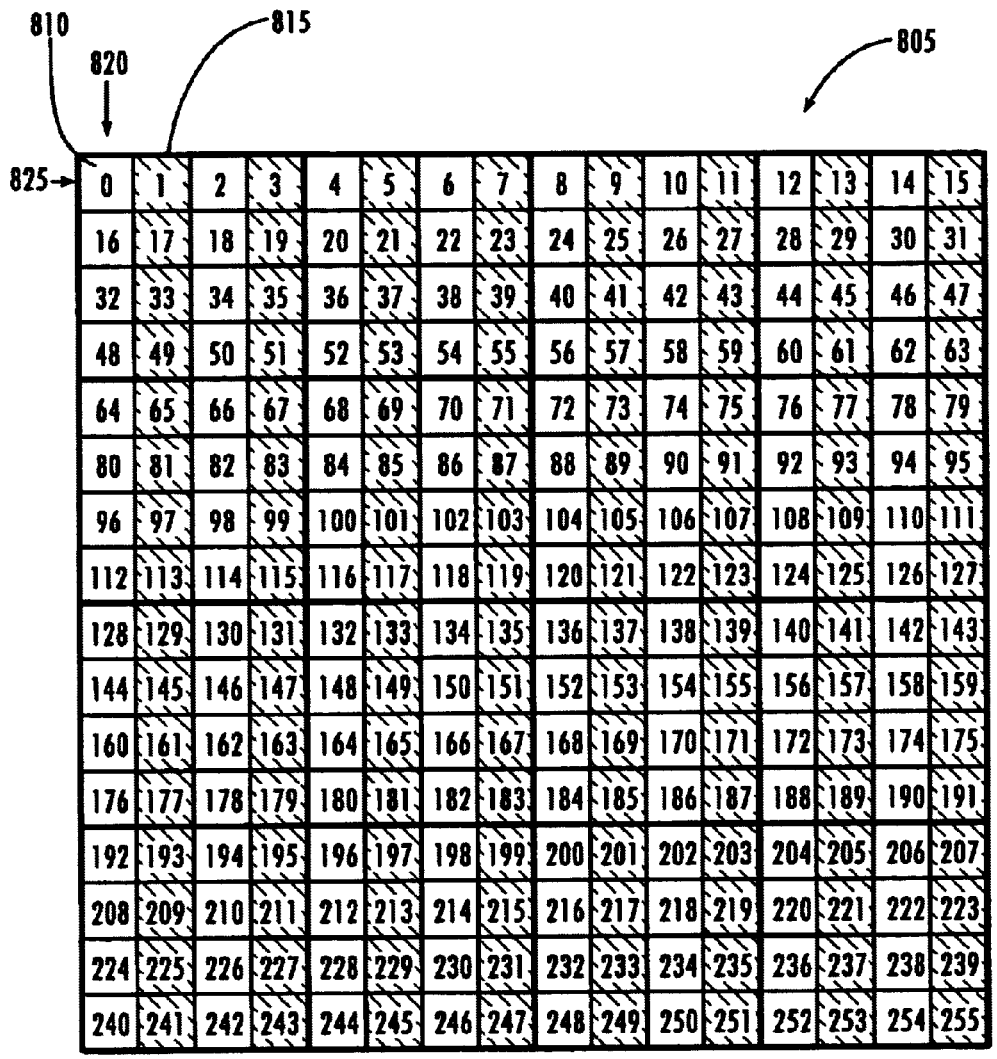
FIG. 8 is a representation of a frame of pixels according to the present invention.

FIG. 8 is a representation of a frame 805 of pixels 810 divided into pixel pages 815. Similar to FIG. 7, frame 805 has 16 frame columns and 16 frame rows (16×16; 256 pixels). Frame 805 is divided into 8 pixel pages 815, outlined in heavier lines, stored in two memory devices. Pixel data for half of the pixels 810 is stored in a first memory device and pixel data for the other half of the pixels 810 is stored in a second memory device (the memory devices are not shown in FIG. 8). Similar to FIGS. 3A, 3B, and 3C, pixels having pixel data stored in the first memory device are indicated by unshaded boxes, such as even-numbered pixels (e.g., pixel 0), and pixels having pixel data stored in the second memory device are indicated by shaded boxes, such as odd-numbered pixels (e.g., pixel 1). Accordingly, pixel data for frame 805 is stored in 16 memory pages, eight in each memory device.

Each pixel page 815 includes 32 pixels 810 and has a pixel page geometry of 8×4, eight pixel page columns 820 and four pixel page rows 825. Accordingly, a pixel page column 820 includes four pixels 810, and a pixel page row 825 includes eight pixels 810. In storing pixel data for frame 805, because pixel pages 815 are eight pixels 810 wide, a page miss would occur storing pixel data for every eight pixels 810. Storing one frame 805 of pixel data would cause a total of 32 page misses (2*16). In retrieving pixel data for frame 805, because pixel pages 815 are four pixels 810 tall, a page miss would occur retrieving pixel data for every four pixels 810. Retrieving one frame 805 of pixel data would cause a total of 32 page misses (4*8; pixel data for two columns of pixels is retrieved in parallel). In total, storing and retrieving one frame 805 of pixels using pixel pages 815 would cause 64 page misses. Accordingly, pixel pages using two memory devices in parallel can provide a further speed improvement.

Pixel pages 815 provide retrieving pixel data for two columns of pixels in parallel (e.g., for the column including pixels 0, 16, 32, etc., and the neighboring column including pixels 1, 17, 33, etc.). Pixel data for each column of pixels is stored in a respective memory device, creating the striped pattern shown in FIG. 8, and so pixel data for one pixel can be retrieved from each memory device at the same time. Pixel pages 815 provide retrieving pixel data for two columns of pixels in parallel. However, in some applications, it is desirable to retrieve pixel data for a single column at a time in a particular order while retaining the benefits of pixel pages. One such application is providing pixel data for one implementation of a GLV.

Figure 9:
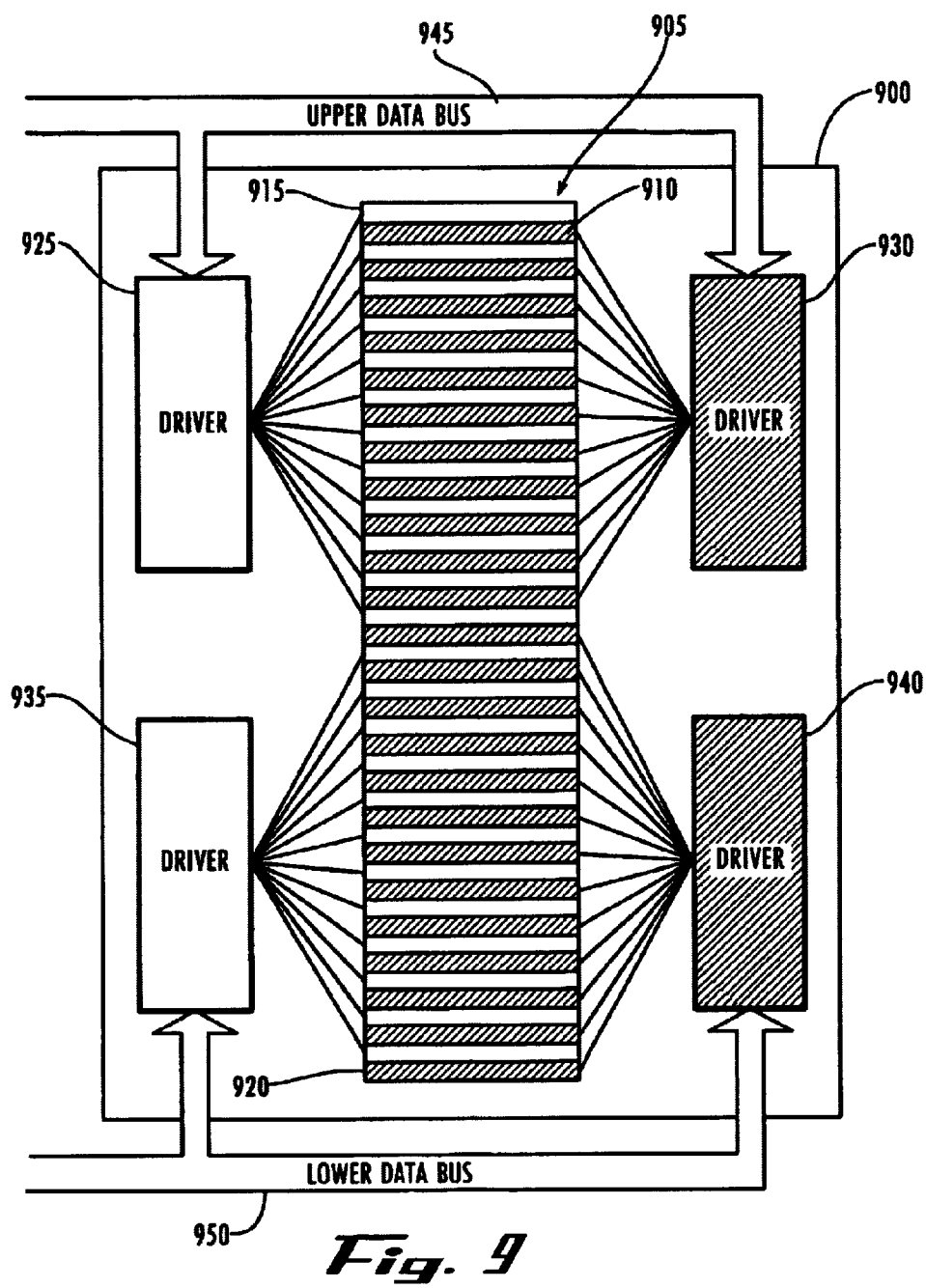
FIG. 9 is a block diagram of one implementation of a grating light valve (GLV) architecture according to the present invention.

FIG. 9 is a block diagram of one implementation of a GLV 900. GLV 900 includes a pixel array 905 of GLV pixels 910. Pixel array 905 includes 1088 GLV pixels 910. In FIG. 9 fewer than 1088 GLV pixels 910 are shown for clarity. As described above, each GLV pixel includes microscopic ribbons that can be deflected to produce a visible pixel on a display surface through a combination of reflection and diffraction. Pixel array 905 is divided into an upper array section 915 and a lower array section 920, each including 544 GLV pixels 910. GLV 900 includes four drivers: first driver 925, second driver 930, third driver 935, and fourth driver 940. First driver 925 and second driver 930 drive GLV pixels 910 in upper array section 915. Third driver 935 and fourth driver 940 drive GLV pixels 910 in lower array section 920.

GLV 900 receives pixel data from an external source, such as a video source as described below. GLV 900 receives pixel data on two data buses in parallel: an upper data bus 945 and a lower data bus 950. Upper data bus 945 provides pixel data for pixels in the upper half of a frame of pixels to first driver 925 and second driver 930. Lower data bus 950 provides pixel data for pixels in the lower half of a frame of pixels to third driver 935 and fourth driver 940. Each data bus 945, 950 provides pixel data for one pixel at a time. Drivers 925, 930, 935, 940 buffer data until pixel data for one frame column of pixels has been stored and then drive the connected GLV pixels 910 to project a column of pixels. In a color GLV system including one GLV for each color (e.g., red, green, and blue) each GLV receives pixel data for that GLV's color on respective data buses. For example, retrieved pixel data is split and bits representing red are sent to one GLV, bits representing green are sent to a second GLV, and bits representing blue are sent to a third GLV.

Each driver 925, 930, 935, 940 controls the deflection of the microscopic ribbons in respective GLV pixels 910 to produce the desired image on the display surface according to pixel data received from data buses 945, 950. Drivers 925, 930, 935, 940 receive pixel data in alternating pairs: first driver 925 and third driver 935, and second driver 930 and fourth driver 940. To represent which drivers receive pixel data together, first driver 925 and third driver 935 are unshaded and second driver 930 and fourth driver 940 are shaded. GLV pixels 910 are also shaded and unshaded according to the corresponding drivers 925, 930, 935, 940.

Accordingly, pixel data for two pixels from upper and lower halves of the same column are to be provided in parallel to GLV 900 through data buses 945, 950. Referring to FIG. 8, pixel data for pixels in the first column (e.g., pixels 0, 16, 32, etc.) are stored in the same memory device and so would not be retrieved in parallel. To provide pixel data for two pixels in parallel to GLV 900 using pixel pages 815, pixel data would be buffered causing a delay.

In an alternative implementation, each data bus 945, 950 provides pixel data for two pixels at a time, one to each of the connected drivers. For example, data bus 945 provides pixel data for a first pixel to driver 925 and pixel data for a second pixel to driver 930 while data bus 950 provides pixel data for a third pixel to driver 935 and for a fourth pixel to driver 940. To provide pixel data for four pixels in parallel, pixel data for two pixels retrieved in parallel is buffered before being placed on data buses 945, 950, such as in video destination 1325 in FIG. 13 described below. The buffered pixel data is provided along with pixel data for the next two pixels (i.e., pixel data for a total of four pixels) to data buses 945, 950.

Figure 10:
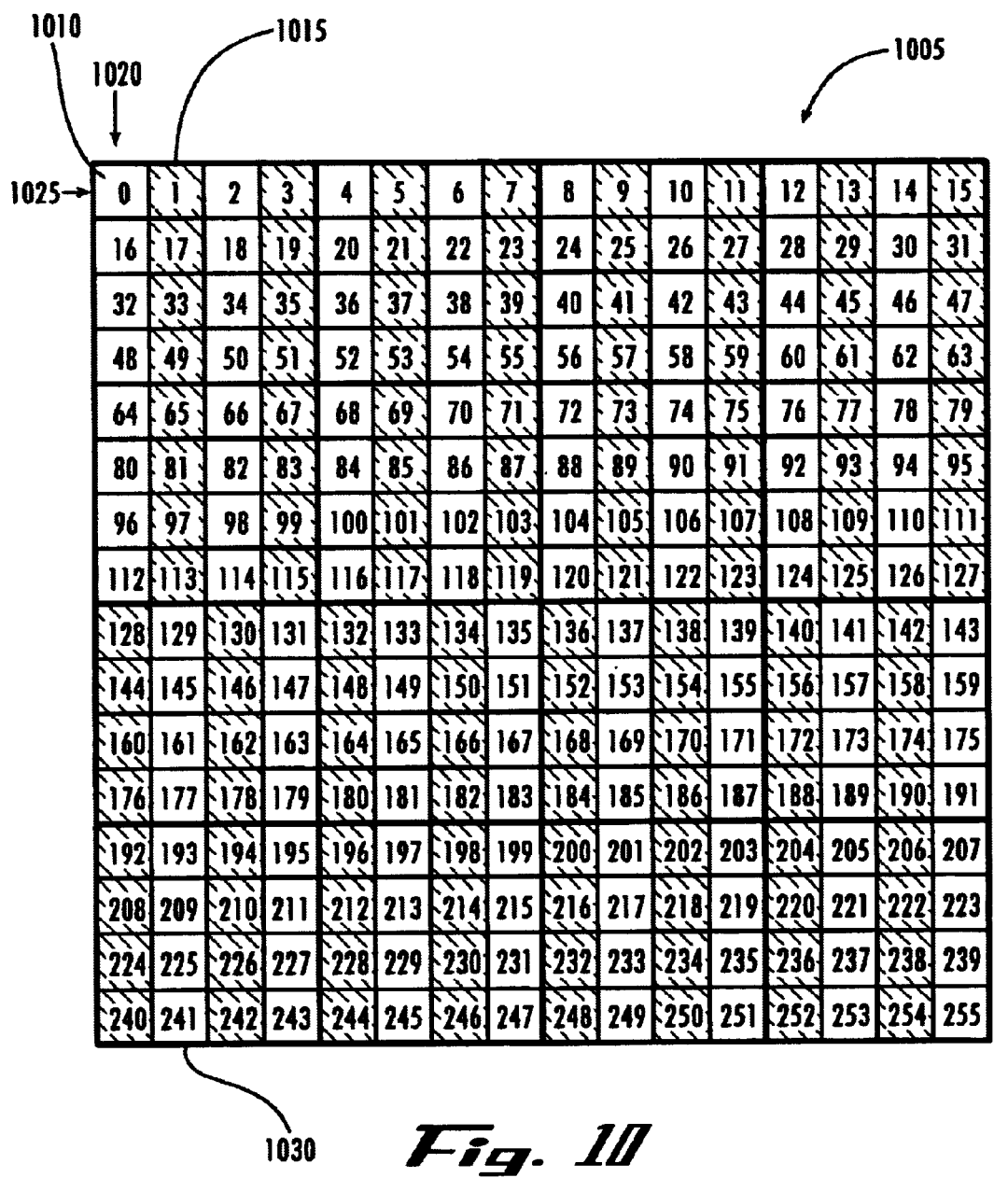

FIG. 10 is a representation of a frame 1005 of pixels 1010 using swapped pixel pages 1015, 1030. Similar to FIG. 7, frame 1005 has 16 frame columns and 16 frame rows (16×16; 256 pixels). Frame 1005 is divided into four first swapped pixel pages 1015 and four second swapped pixel pages 1030, outlined in heavier lines, stored in two memory devices. First swapped pixel pages 1015 are used in the upper half of the frame and second swapped pixel pages 1030 are used in the lower half of the frame. Pixel data for half of the pixels 1010 is stored in a first memory device and pixel data for the other half of the pixels 1010 is stored in a second memory device (the memory devices are not shown in FIG. 10). Similar to FIGS. 3A, 3B, and 3C, pixels having pixel data stored in the first memory device are indicated by unshaded boxes, such as even-numbered pixels in the upper half of the frame (e.g., pixel 0), and pixels having pixel data stored in the second memory device are indicated by shaded boxes, such as odd-numbered pixels in the upper half of the frame (e.g., pixel 1). Accordingly, pixel data for frame 1005 is stored in 16 memory pages, eight in each memory device. Each swapped pixel page 1015, 1030 includes 32 pixels 1010 and has a pixel page geometry of 8×4, eight pixel page columns 1020 and four pixel page rows 1025. Accordingly, a pixel page column 1020 includes four pixels 1010, and a pixel page row 1025 includes eight pixels 1010.

First swapped pixel pages 1015 and second swapped pixel pages 1030 include the same number of pixels 1010, but the order pixel data is stored in the memory devices is reversed, or swapped. Pixel data for pixels in the first pixel page column 1020 of a first swapped pixel page 1015 is stored in the first memory device. Pixel data for pixels in the first pixel page column 1020 of a second swapped pixel page 1030 is stored in the second memory device. Pixel data for pixels in the remaining pixel page columns 1025 of the swapped pixel pages 1015, 1030 is stored alternately in the first and second memory devices, as illustrated in FIG. 10. For example, the swapped pixel page including pixels 0, 16, 32, and 48 is a first swapped pixel page 1015. Pixel data for pixels 0, 16, 32, and 48 is stored in the first memory device and pixel data for pixels 1, 17, 33, and 49 is stored in the second memory device. The swapped pixel page including pixels 128, 144, 160, and 176 is a second swapped pixel page 1030. Pixel data for pixels 128, 144, 160, and 176 is stored in the second memory device and pixel data for pixels 129, 145, 161, and 177 is stored in the first memory device.

Pixels 1010 in the upper half of frame 1005 are stored and retrieved using first swapped pixel pages 1015. Pixels 1010 in the lower half of frame 1005 are stored and retrieved using second swapped pixel pages 1030. Frame 1005 is sixteen pixels 1010 tall, having 16 frame rows, so pixels 1010 in the upper eight frame rows (e.g., pixels 0–127) are in first swapped pixel pages 1015, and pixels 1010 in the lower eight frame rows (e.g., pixels 128–255) are in second swapped pixel pages 1030. As a result, pixel data for half of the pixels 1010 in a frame column is stored in one memory device and pixel data for the other half of the pixels 1010 in the same frame column is stored in the other memory device.

For frame 1005, pixel data would be stored according to horizontal rows of pixels, two pixels at a time. Two horizontally adjacent pixels form a horizontal pixel pair and pixel data for the pixels of a horizontal pixel pair is stored in parallel. As described below, pixel data for a horizontal pixel pair is stored at the same address in each memory device. For example, pixel data for pixel 0 is stored at address 0 in the first memory device and pixel data for pixel 1 is stored at address 0 in the second memory device.

Pixel data for the upper half of frame 1005 is stored using first swapped pixel pages 1015. Accordingly, pixel data for the upper half of frame 1005 is stored for horizontal pixel pairs following this sequence (first memory device-second memory device): 0-1, 2-3, 4-5, . . . , 126-127. Pixel data for the lower half of frame 1005 is stored using second swapped pixel pages 1030. Accordingly, pixel data for the lower half of frame 1005 is stored for horizontal pixel pairs following this sequence (second memory device-first memory device): 128-129, 130-131, 132-133, . . . 254-255. While the pattern of the sequence of horizontal pixel pairs does not change between the upper and lower halves of frame 1005, which memory device stores pixel data for the pixels in the horizontal pixel pair switches with each half Pixel data would be retrieved according to vertical columns of pixels, two pixels at a time. One pixel from the upper half of frame 1005 and one pixel from the same frame column in the lower half of frame 1005 form a vertical pixel pair. For example, pixels 0 and 128 form a vertical pixel pair, as well as pixels 1-129, 2--130, 16-144, 32-160, and so on. Pixel data for the pixels of a vertical pixel pair is retrieved in parallel. Pixel data for the upper half of frame 1005 is retrieved using first swapped pixel pages 1015. Pixel data for the lower half of frame 1005 is retrieved using second swapped pixel pages 1030. Accordingly, pixel data for frame 1005 is retrieved for vertical pixel pairs following this sequence (first memory device-second memory device): 0-128, 16-144, 32-160, . . . , 112-240, 129-1, 145-17, . . . , 255-127. While the pattern of the sequence of vertical pixel pairs does not change throughout frame 1005, which memory device provides pixel data for the pixels in the vertical pixel pair switches with each column.

By retrieving pixel data using swapped pixel pages, pixel data for the upper and lower half of a frame can be retrieved in parallel and provided to the upper and lower data buses of a GLV as shown in FIG. 9. Pixel data for a vertical pixel pair is retrieved in parallel from two memory devices. Pixel data for the pixel in the upper half of the frame is provided to upper data bus 945. Pixel data for the pixel in the lower half of the frame is provided to lower data bus 950.

Figure 11:
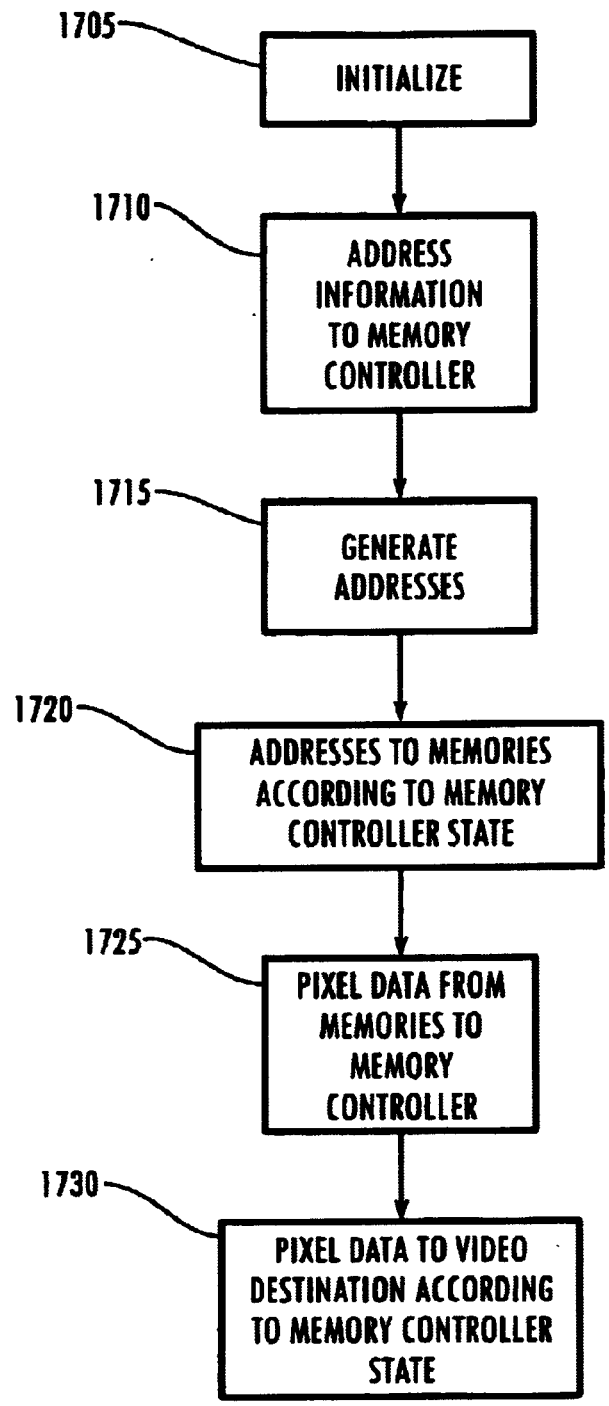
FIG. 11 is a representation of one implementation of a first swapped pixel page of pixels and one implementation of a second swapped pixel page of pixels in an HD resolution implementation using two memory devices according to the present invention.

FIG. 11 is a representation of one implementation of a first swapped pixel page 1105 and a second swapped pixel page 1150 in an HD resolution implementation (1920×1080) using two memory devices. Swapped pixel pages 1105,1150 have a pixel page geometry of 32×16. Pixels 1110 in first swapped pixel page 1105 are numbered as the pixels 1110 would be numbered in the corresponding 1920×1080 frame for the initial swapped pixel page 1105 in the upper half of the frame. Pixels 1110 in second swapped pixel page 1150 are numbered as the pixels 1110 would be numbered for the initial swapped pixel page 1150 in the lower half of the frame, as described below (as shown in FIG. 11, the lower half of the frame begins with pixel 1044480 in frame row 544). Similar to FIG. 10, unshaded boxes indicate pixels 1110 for which pixel data is stored in one memory device and shaded boxes indicate pixels 1110 for which pixel data is stored in the other memory device. Swapped pixel pages 1105, 1150 include 512 pixels 1110 and have a pixel page geometry of 32×16, 32 pixel page columns 1115 (numbered 0 to 31) and 16 pixel page rows 1120 (numbered 0 to 15). A pixel page column 1115 includes 16 pixels 1110 and a pixel page row 1120 includes 32 pixels 1110. For clarity, not every pixel 1110 of swapped pixel pages 1105, 1150 is shown in FIG. 11. Ellipses indicate intervening pixels 1110.

Two pixels have pixel data stored at the same address in different memory devices. For example, the first pixel of a frame is pixel 0, in frame row 0 and frame column 0, in pixel page row 0 and pixel page column 0 of swapped pixel page 0, stored at memory address 0 in memory page 0 of memory device 0. The second pixel of a frame (horizontally) is pixel 1, in frame row 0 and frame column 1, in pixel page row 0 and pixel page column 1 of swapped pixel page 0, stored at memory address 0 in memory page 0 of memory device 1.

As described above, an HD resolution frame has 2,073, 600 pixels, in 1920 frame columns and 1080 frame rows. Each swapped pixel page 1105, 1150 is 32 pixels 1110 wide, so one frame has at least 60 swapped pixel pages 1105, 1150 horizontally. Each swapped pixel page 1105, 1150 is 16 pixels 1110 tall, so one frame has at least 68 swapped pixel pages 1105, 1150 vertically (though the second swapped pixel pages 1150 in the 68$^{th}$ row of swapped pixel pages 1105, 1150 are not completely filled with valid screen pixels, where a "valid" screen pixel is a pixel in the frame for which pixel data has been provided from the video source). In total, one frame has at least 4080 swapped pixel pages 1105, 1150 allocated, where each allocated swapped pixel page has a corresponding memory page in each memory device.

As described above referring to one implementation of a GLV in FIG. 9, a GLV has 1088 GLV pixels 910 in two sections 915, 920 of 544 GLV pixels 910 each. However, a 1920×1080 HD resolution frame is only 1080 pixels tall. In one implementation, the frame is treated as though the frame is 1088 pixels tall, and so each half of the frame is treated as having 544 rows of pixels. Accordingly, the upper half of the frame includes frame rows 0–543 (pixels 0–1044479). The lower half of the frame includes frame rows 544–1079 (pixels 1044480–2073599) and an additional eight rows of invalid pixels. Accordingly, the lower half of the frame has valid screen pixels for 536 frame rows (frame rows 544–1079). For the invalid pixels in the remaining eight rows of the lower half of the frame (i.e., what would be frame rows 1080–1087), video source 1305 can provide blank data, such as black color data.

In an alternative implementation, to match the upper half of the frame to the upper section 915 of GLV pixels 910 and the lower half of the frame to the lower section 920 of GLV pixels 910, the first four GLV pixels 910 of the upper section 915 are not used and the last four GLV pixels 910 of the lower section 920 are not used. In another implementation, these GLV pixels 910 are always provided with blank pixel data, such as to display black. For example, pixel data for the first pixel in the upper half of a column (e.g., pixel 0) is provided to the fifth GLV pixel 910 in the upper section 915 and pixel data for the first pixel in the lower half of the column (e.g., pixel 1036800) is provided to the first GLV pixel 910 in the lower section 920. Pixel data for the last pixel in the upper half of the column is provided to the 544$^{th}$ GLV pixel 910 in the upper section 915 and pixel data for the last pixel in the lower half of the column (e.g., pixel 2071680) is provided to the 540$^{th}$ GLV pixel 910 in the lower section 920.

In an HD resolution implementation, pixel data is stored and retrieved in similar sequences to those described above. Pixel data is stored along horizontal frame rows, for two pixels at a time, such as this sequence of horizontal pixel pairs: 0-1, 2-3, and so on. Pixel data for the pixels in a horizontal pixel pair is stored at the same address in each memory device. Which memory device stores pixel data for which pixel in a horizontal pixel pair switches between halves of the frame. Pixel data is retrieved along vertical frame columns, for two pixels at a time, such as this sequence of vertical pixel pairs: 0-1044480, 1920-1046400, and so on. Which memory device provides pixel data for which pixel in a vertical pixel pair switches with each column of the frame. Various geometries and page sizes can be used for swapped pixel pages in other implementations, such as 8×32, 16×32, or 64×16.

B. Video Data System Using Swapped Pixel Pages

Figure 12:
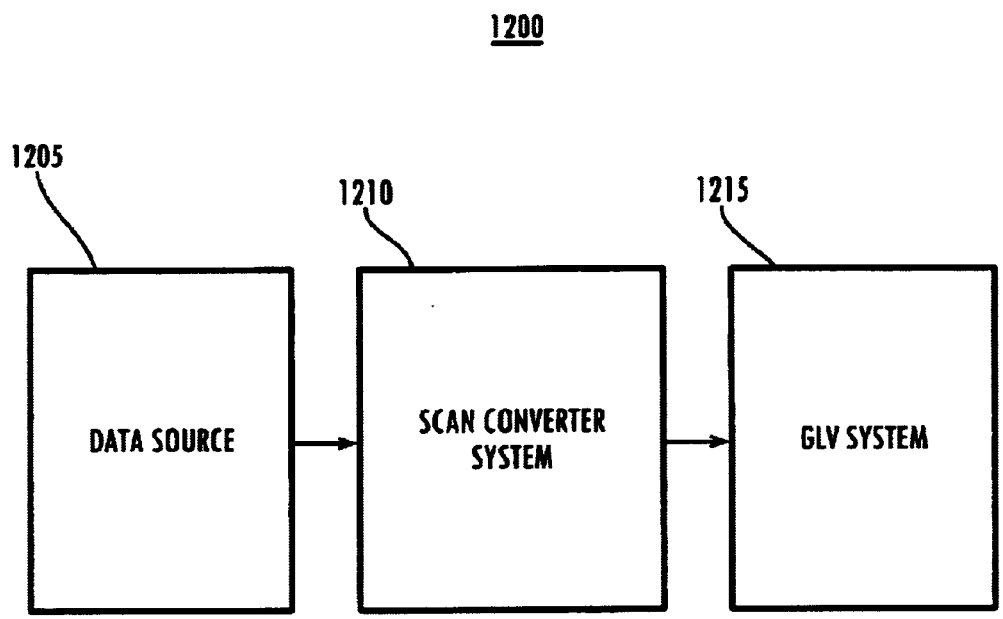
FIG. 12 is a block diagram of a video data system according to the present invention.

FIG. 12 is a block diagram of a video data system 1200. A data source 1205 provides video data for frames of pixels to a scan converter system 1210 in a first order. Scan converter system 1210 stores the data using swapped pixel pages, as described above. Scan converter system 1210 retrieves the data in a second order and provides the retrieved data to a GLV system 1215. For a video application, scan converter system 1210 can be used as a type of scan converter between data source 1205 and GLV system 1215.

Data source 1205 is a video source providing pixel data to scan converter system 1210 and GLV system 1215 is a display system using one or more GLV's. Data source 1205 provides pixel data according to horizontal rows of pixels. GLV system 1215 receives pixel data according to upper and lower halves of vertical columns of pixels, as described above. Scan converter system 1210 provides the conversion.

Data source 1205 can be implemented to provide pixel data according to various screen resolutions, such as an HD resolution of 1920×1080. While the discussion herein focuses on this HD resolution, alternative implementations can accommodate other resolutions. For an HD resolution signal, data source 1205 provides pixel data for a progressive signal (e.g., 1920×1080 p). Data source 1205 can be implemented to receive an interlaced signal (e.g., 1920×1080 i) and provide a progressive signal, such as by merging interlaced fields using a de-interlacer. In an alternative implementation, data source 1205 provides an interlaced signal, providing pixel data for half the screen pixels (i.e., first field) and then pixel data for the other half (i.e., second field). In another implementation, data source 1205 provides pixel data using progressive segmented frames ("PSF," by Sony Corporation of Japan, Inc.).

Each pixel has 32 bits of pixel data. In one implementation, 11 bits are for red, 11 bits are for green, and 10 bits are for blue. Alternative implementations may have different allocations (e.g., 10 bits per color) or pixel depths (e.g., 8 or 24 bits per pixel). Where data source 1205 provides pixel data at 1920×1080 p and 32 bits per pixel, the pixel rate is approximately 150 MP/S and the data rate from data source 1205 is approximately 600 MB/S. Accordingly, scan converter system 1210 stores pixel data from data source 1205 at a data rate of approximately 600 MB/S. To provide pixel data at a rate to support the same resolution, 1920×1080 p, scan converter system 1210 outputs pixel data to GLV system 1215 at a data rate of approximately 600 MB/S.

GLV system 1215 can be a color GLV system. One color GLV system includes three GLV's: one for red, one for green, and one for blue. As described above, a GLV uses vertical columns of pixels to form an image (projecting one column at a time, typically left to right). In a color GLV system, each GLV projects a column of pixels (e.g., 1088 pixels, though only 1080 may have corresponding pixel data from the video data source) at a time. The three color columns are combined (such as using mirrors and lenses) to form a single apparent column on the viewing area (not shown in FIG. 12). Accordingly, it is advantageous for the GLV system to receive pixel data according to vertical columns of pixels, rather than horizontal rows. Scan converter system 1210 provides the pixel data to the GLV system corresponding to vertical columns of pixels.

C. Swapped Pixel Pages System Using Two Memory Devices

An HD implementation (1920×1080 screen resolution) of a system using swapped pixel pages is described below. This implementation is illustrative of the operation of one system and alternative implementations are possible. The operation of this system is generally similar to the pixel page systems described in U.S. application Ser. No. 10/051,538, filed Jan. 16, 2002, except for aspects affected by using swapped pixel pages, and variations described therein may be applied to alternative implementations of the present invention as well.

Figure 4:
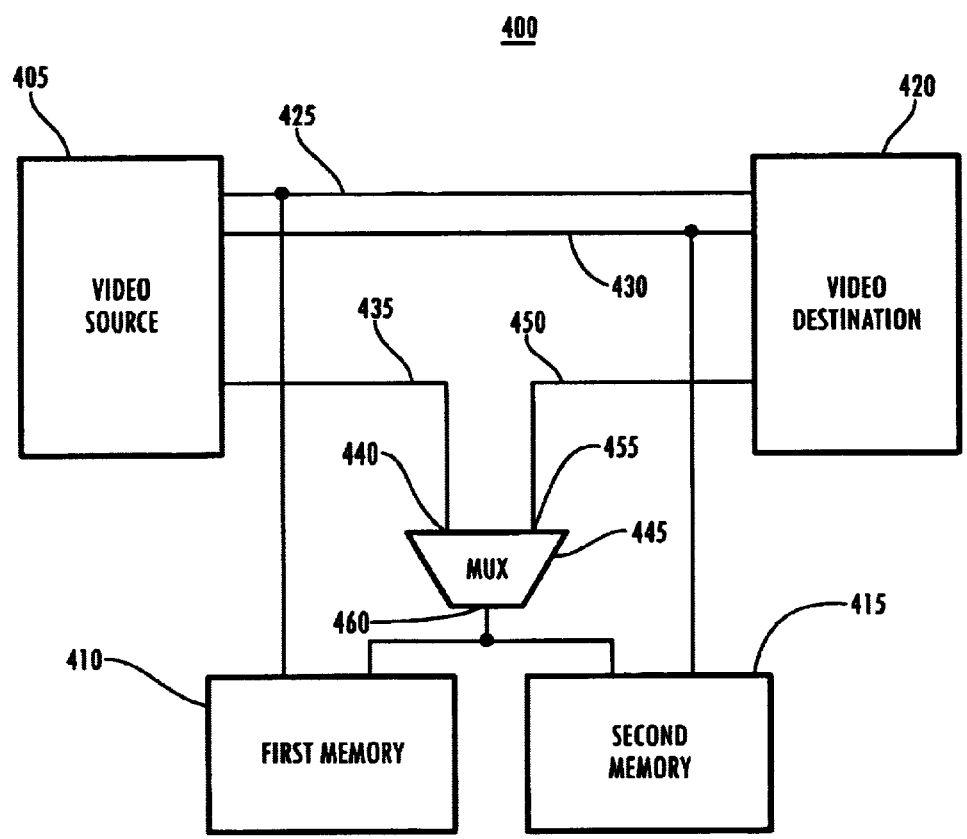
FIG. 4 is a block diagram of a typical frame buffer architecture capable of accessing pixel data for two pixels in parallel.
Figure 5:
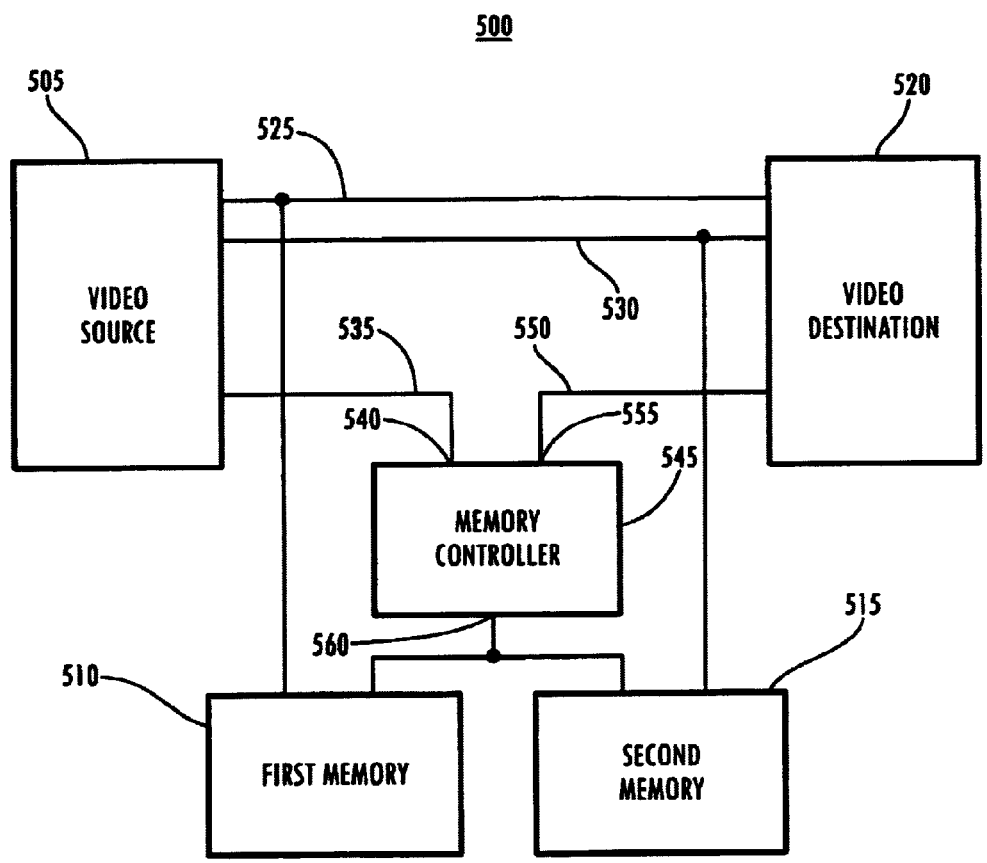
FIG. 5 is a block diagram of another implementation of a dual pixel frame buffer architecture.
Figure 6A:
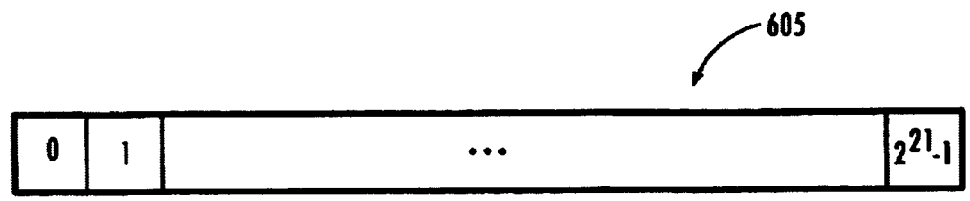
FIG. 6A is a representation of 2,097,152 memory locations as a one-dimensional array.
Figure 6B:
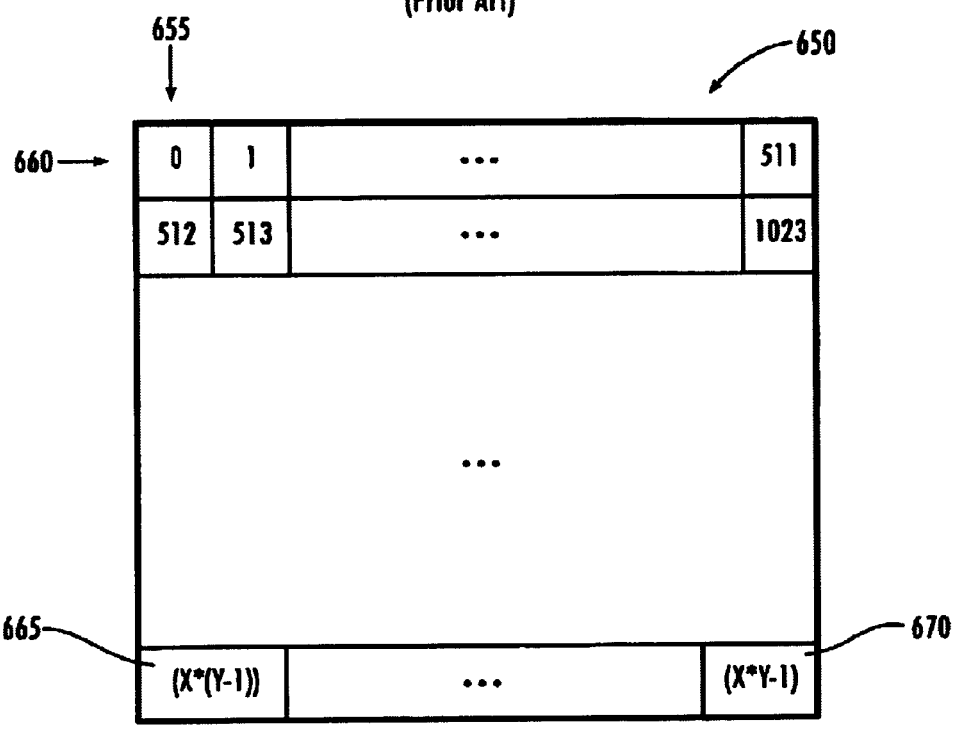
FIG. 6B is a representation of 2,097,152 memory locations as a two-dimensional array or grid.
Figure 6C:
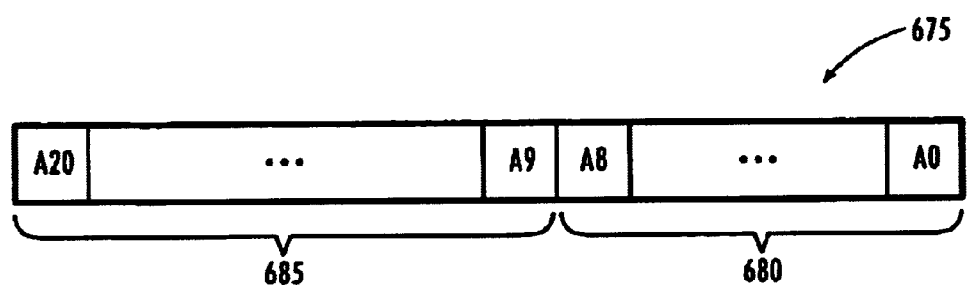
FIG. 6C is a representation of an address for one memory location out of 2,097,152.
Figure 13:
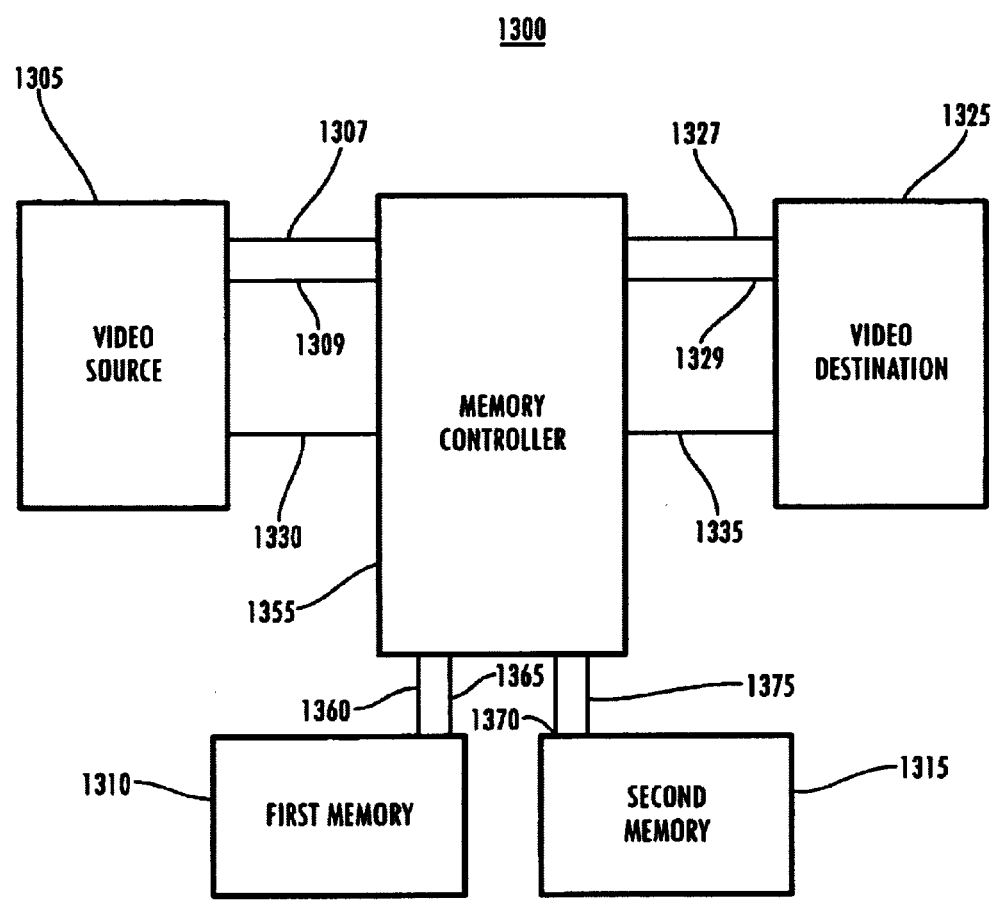
FIG. 13 is a block diagram of a dual pixel frame buffer architecture according to the present invention.

FIG. 13 is a block diagram of a dual pixel frame buffer architecture 1300. Architecture 1300 is similar to architectures 400 and 500 in FIGS. 4 and 5, respectively, however, architecture 1300 includes a memory controller 1355 centrally interconnecting video source 1305, video destination 1325, first memory 1310 and second memory 1315. Memory controller 1355 controls routing pixel data from video source 1305 to memories 1310 and 1315 and routing pixel data from memories 1310 and 1315 to video destination 1325. Memory controller 1355 controls the operation of memories 1310 and 1315, such as the read or write state, and also generates addresses for storing pixel data to and retrieving data from memories 1310 and 1315, as described below. In an alternative implementation, separate address generators for storing and retrieving data provide addresses to memory controller 1355. In addition, memory controller 1355 controls switching connections to alternate properly between memories 1310 and 1315, as described below. In storing pixel data, memory controller 1355 switches which memory device to store pixel data for which pixel of a horizontal pixel pair after storing pixel data for half of a frame. In retrieving pixel data, memory controller 1355 switches from which memory device to provide pixel data to which data bus connected to video destination 1325 after retrieving pixel data for a frame column of pixels. In another alternative implementation, a separate memory controller is provided for and connected to each memory and generates addresses for the connected memory.

Memory controller 1355 operates to provide the mapping of swapped pixel pages from pixels to memory locations. In aspects other than swapped pixel pages, such as generating addresses, architecture 1300 operates similarly to dual pixel architectures 400 and 500, as described above. In alternative implementations, an architecture structurally similar to architecture 400 or architecture 500 can be used (e.g., an architecture including address multiplexors and having address generation controlled by video source and video destination), with modifications as described below.

A video source 1305 provides pixel data to a first memory 1310 and to a second memory 1315 in parallel and a video destination 1325 retrieves pixel data from first memory 1310 and from second memory 1315 in parallel. First memory 1310 and second memory 1315 are separate memory devices, such as two 32-bit wide 8 MB SDRAM's (e.g., 2 M×32 SDRAM MT48LC2M32B2 by Micron Technology, Inc.). The SDRAM is preferably fast enough to support the data rate needed for the screen resolution, such as 150 MHz or 166 MHz. Other types of memory can also be used, such as SGRAM (synchronous graphics RAM). Memories 1310 and 1315 each store half the pixel data of a particular frame.

Video source 1305 receives video data from another source (not shown), such as a broadcast source or a software application running on a computer system connected to video source 1305. Video source 1305 outputs pixel data for pixels two at a time, a first pixel on a first data bus 1307 and a second pixel on a second data bus 1309. In one implementation, video source 1305 and video destination 1325 include FIFO buffers, such as to avoid buffer overrun or underrun. In another implementation, these FIFO buffers are included in memory controller 1355.

Video destination 1325 provides pixel data to a display system (not shown in FIG. 13), such as GLV system 1215 in FIG. 12. Video destination 1325 receives pixel data for pixels two at a time, a first pixel on a third data bus 1327 and a second pixel on a fourth data bus 1329. As described above, video destination 1325 retrieves pixel data for two pixels from respective halves of a frame column in parallel. Video destination 1325 receives pixel data for pixels in the upper half of the frame on third data bus 1327 and pixel data for pixels in the lower half of the frame on fourth data bus 1329. Accordingly, in one implementation, video destination 1325 provides pixel data from third bus 1327 to the upper drivers of the GLV system (e.g., through upper data bus 945 in FIG. 9) and provides pixel data from fourth data bus 1329 to the lower drivers of the GLV system (e.g., through lower data bus 950 in FIG. 9). As described above, in one implementation, video destination buffers pixel data for two pixels while receiving pixel data for the next two pixels and provides pixel data for the four pixels at one time to the GLV system.

First data bus 1307 and second data bus 1309 are connected to video source 1305 and memory controller 1355. Third data bus 1327 and fourth data bus 1329 are connected to video destination 1325 and memory controller 1355. Memory controller 1355 receives signals from video source 1305 and video destination 1325 through control lines 1330 and 1335, respectively, for addressing (e.g., indicating whether pixel data is to be stored to or retrieved from memories 1310 and 1315), or that horizontal and vertical synchronization signals have been received (e.g., to indicate the end of a frame row of pixels or the end of a frame, respectively). A first memory data bus 1360 and a first memory address bus 1365 are connected to memory controller 1355 and first memory 1310. A second memory data bus 1370 and a second memory address bus 1375 are connected to memory controller 1355 and second memory 1315. First memory 1310 and second memory 1315 also receive control signals (not shown) from memory controller 1355 to control whether memories 1310 and 1315 will read in data (write mode) or read out data (read mode). In addition, while clock lines are not shown in FIG. 13, architecture 1300 operates based on clock cycles so that pixel data can be processed for two pixels per clock cycle in support of the desired pixel rate.

Memory controller 1355 has two states for storing data and two states for retrieving data In a first state for storing data, memory controller 1355 provides pixel data from first data bus 1307 to first memory 1310 and from second data bus 1309 to second memory 1315. In a second state for storing data, memory controller 1355 provides pixel data from first data bus 1307 to second memory 1315 and from second data bus 1309 to first memory 1310. Memory controller 1355 changes states for storing data after storing pixel data for half of a frame of pixels, such as based on counting frame rows. In a first state for retrieving data, memory controller 1355 provides pixel data from first memory 1310 to third data bus 1327 and from second memory 1315 to fourth data bus 1329. In a second state for retrieving data, memory controller 1355 provides pixel data from first memory 1310 to fourth data bus 1329 and from second memory 1315 to third data bus 1327. Memory controller 1355 changes states for retrieving data after retrieving pixel data for each frame column.

For example, in the upper half of the frame, pixel data for the first pixel in the horizontal pixel pair (e.g., pixel 0) is stored to first memory 1310 and pixel data for the second pixel in the horizontal pixel pair (e.g., pixel 1) is stored to second memory 1315. In the lower half of the frame, pixel data for the first pixel in the horizontal pixel pair (e.g., pixel 1044480) is stored to second memory 1315 and pixel data for the second pixel in the horizontal pixel pair (e.g., pixel 1044481) is stored to first memory 1310. In retrieving pixel data, for the leftmost frame column (frame column 0), pixel data for the first pixel in the vertical pixel pair (e.g., pixel 0) is retrieved from first memory 1310 and pixel data for the second pixel in the vertical pixel pair (e.g., pixel 1044480) is retrieved from second memory 1315. For the next frame column (frame column 1), pixel data for the first pixel in the vertical pixel pair (e.g., pixel 1) is retrieved from second memory 1315 and pixel data for the second pixel in the vertical pixel pair (e.g., pixel 1044481) is retrieved from first memory 1310.

In operation, memories 1310 and 1315 read in or store complementary halves of a frame of pixels as pixel data from video source 1305 and output the pixel data to video destination 1325. Memory controller 1355 controls address generation to map pixel data to memory locations. As described above, memory controller 1355 stores pixel data for a frame of pixels from video source 1305 two pixels at a time according to horizontal rows of pixels. After storing one frame, memory controller 1355 retrieves the pixel data two pixels at a time according to vertical columns of pixels and provides the pixel data to video destination 1325. After retrieving the pixel data for the entire frame, memory controller 1355 stores pixel data for the next frame, and so on. Some pixel data for the next frame may be buffered, such as in video source 1305, while pixel data for the previous frame is being retrieved. In alternative implementations, the storage and retrieval can be interleaved or occur in parallel.

In one implementation, for an HD resolution of 1920× 1080, the pixel page geometry is 32×16 and 4080 swapped pixel pages are allocated to one frame, 60 horizontally by 68 vertically. Two 32×16 swapped pixel pages are shown in FIG. 11. Storing and retrieving pixel data for this pixel page geometry and pixel page allocation is described below. Alternative pixel page geometries and pixel page allocations may store and retrieve data differently. Various additional illustrative implementations of storing and retrieving pixel data using pixel pages are described in U.S. application Ser. No. 10/051,538, filed Jan. 16, 2002. For example, swapped pixel pages can be allocated according to a power of two (e.g., 64×128) and addressing can be based on bit-fields. In another implementation, memory space is divided based on a power of two for corresponding halves of the frame to provide a type of bit-field addressing. Variations of these illustrative implementations to meet different pixel page geometries and pixel page allocations will be apparent to one of ordinary skill in the art.

FIG. 14 is a table 1400 showing the relationships among a pixel, a frame row, a frame column, a swapped pixel page, a pixel page row, a pixel page column, a memory page, a memory address, and a memory device for an HD resolution implementation (1920×1080) using swapped pixel pages 1105, 1150 in FIG. 11. In FIG. 14, the pixel data for a frame is stored in two memory devices, each having 256 memory locations per memory page. As described above, in one implementation, each memory device is an 8 MB device. 2048 memory pages are allocated to each half of the frame in each device and 2040 pixel pages are allocated to each half of the frame. For example, memory pages 0–2047 in each device are used for storing pixel data for the upper half of a frame (frame rows 0–543) and memory pages 2048–4095 are used for storing pixel data for the lower half of the frame (frame rows 544–1079). In this case, pixel data for pixel pages 0–2039 is divided between memory pages 0–2039 in each memory device and pixel data for pixel pages 2040–4079 is divided between memory pages 2048–4087 in each memory device. Accordingly, 16 memory pages in each memory device are not used (e.g., memory pages 2040–2047 and 4088–4095 in each memory device). In addition, FIG. 14 shows only a representative sample of pixels from a frame for clarity. As described above, an HD resolution frame has 2,073,600 pixels.

Column 1405 indicates the number of a pixel for which related information is shown in table 1400. Pixels in a frame are numbered from 0, left to right, top to bottom. For example, the first pixel in the frame is numbered 0, the last pixel of the first frame row is numbered 1919, and the first pixel of the second frame row is numbered 1920. Column 1410 indicates a frame row including the pixel in column 1405. Frame rows are numbered from 0, top to bottom. Column 1415 indicates a frame column including the pixel in column 1405. Frame columns are numbered from 0, left to right. Column 1420 indicates a swapped pixel page including the pixel in column 1405. Swapped pixel pages in a frame are numbered from 0, left to right, top to bottom. Referring to FIGS. 10 and 11, first swapped pixel pages and second swapped pixel pages are numbered in sequence (i.e., the first second swapped pixel page is swapped pixel page 2040). Column 1425 indicates a pixel page row including the pixel in column 1405. Pixel page rows are numbered from 0, from top to bottom within the swapped pixel page including the pixel page row. Column 1430 indicates a pixel page column including the pixel in column 1405. Pixel page columns are numbered from 0, left to right within the swapped pixel page including the pixel page column. Column 1435 indicates a memory page storing pixel data for the pixel in column 1405. Memory pages are numbered sequentially from 0. Column 1440 indicates a memory address of a memory location storing pixel data for the pixel in column 1405. Column 1445 indicates which memory device stores pixel data for the pixel in column 1405. The two memory devices are numbered 0 and 1. XXX indicates an invalid screen pixel, frame row, or frame column. Invalid screen pixels, frame rows, and frame columns are outside the dimensions of the screen resolution (e.g., frame rows beyond 1079 in HD resolution 1920×1080). Memory locations are allocated for invalid screen pixels, frame rows, and frame columns in allocated swapped pixel pages, but these memory locations are not used.

As described above, two pixels have pixel data stored at the same address in different devices. As shown in table 1400, which memory device stores pixel data for which pixel in a horizontal pixel pair is reversed in the lower half of the frame. In the upper half of a frame, pixel data for the left pixel in a horizontal pixel pair is stored in the first device and pixel data for the right pixel is stored in the second memory device. In the lower half of the frame, pixel data for the right pixel in a horizontal pixel pair is stored in the first device and pixel data for the left pixel is stored in the second memory device.

For example, the first horizontal pixel pair of the upper half of a frame is pixel 0 and pixel 1. Pixel 0 is in frame row 0 and frame column 0, in pixel page row 0 and pixel page column 0 of swapped pixel page 0, and pixel data for pixel 0 is stored at memory address 0 in memory page 0 of memory device 0. Pixel 1 is in frame row 0 and frame column 1, in pixel page row 0 and pixel page column 1 of swapped pixel page 0, and pixel data for pixel 1 is stored at memory address 0 in memory page 0 of memory device 1.

The first horizontal pixel pair of the lower half of the frame is pixel 1044480 and pixel 1044481. Pixel 1044480 is in frame row 544 and frame column 0, in pixel page row 0 and pixel page column 0 of swapped pixel page 2040, and pixel data for pixel 1044480 is stored at memory address 524288 in memory page 2048 of memory device 1. Pixel 1044481 is in frame row 544 and frame column 1, in pixel page row 0 and pixel page column 1 of swapped pixel page 2040, and pixel data for pixel 1044481 is stored at memory address 524288 in memory page 2048 of memory device 0.

Some swapped pixel pages at the end of each column of swapped pixel pages do not include valid screen pixels. 68 swapped pixel pages are allocated vertically to the frame. Each swapped pixel page is 16 pixels tall and so 68 swapped pixel pages can include a column of 1088 pixels vertically. However, an HD resolution frame is only 1080 pixels tall and so has valid screen pixels for 67 swapped pixel pages and 8 pixel page rows of a $68^{th}$ swapped pixel page, vertically. As a result, eight pixel page rows in each of the swapped pixel pages in the $68^{th}$ row of swapped pixel pages (i.e., swapped pixel pages 4020 through 4079) do not include valid screen pixels. For example, pixel 2073599 (i.e., the last pixel of the last frame row) is in pixel page row 7 of swapped pixel page 4079 and pixel data for pixel 2073599 is stored at address 1046399. Pixel page rows 8 through 15 of swapped pixel page 4079 do not include valid screen pixels. However, memory page 4087 includes 256 memory locations with addresses from 1046272 through 1046527. Addresses 1046400 through 1046527 are not used in each memory device. A similar situation occurs in each of the memory pages corresponding to the $68^{th}$ row of swapped pixel pages (i.e., memory pages 4028 through 4087). In an alternative implementation, the memory locations corresponding to the last eight pixel page rows of the $68^{th}$ row of swapped pixel pages store a predefined value, such as data to cause a GLV to display black.

As described above, memory controller 1355 stores pixel data according to horizontal rows of pixels. Memory controller 1355 generates source addresses to store pixel data for two pixels in parallel. In an HD resolution implementation, memory controller 1355 stores pixel data for pixel pairs in this sequence (first memory 1310—second memory 1315): 0-1, 2-3, 4-5, and so on. Referring to FIG. 14, memory controller 1355 generates addresses in the following sequence (one address for each pixel pair): 0, 1, . . . , 15, 256, 257, . . . , 271, 512, . . . , 15119, 16, 17, and so on. As described above, pixel data for pixels in different swapped pixel pages is stored in different memory pages. Memory controller 1355 provides the same address to each of memory devices 1310, 1315 for one horizontal pixel pair. Memory controller 1355 switches which memory device 1310, 1315 to store pixel data for which pixel after storing pixel data for half of a frame.

Figure 15:
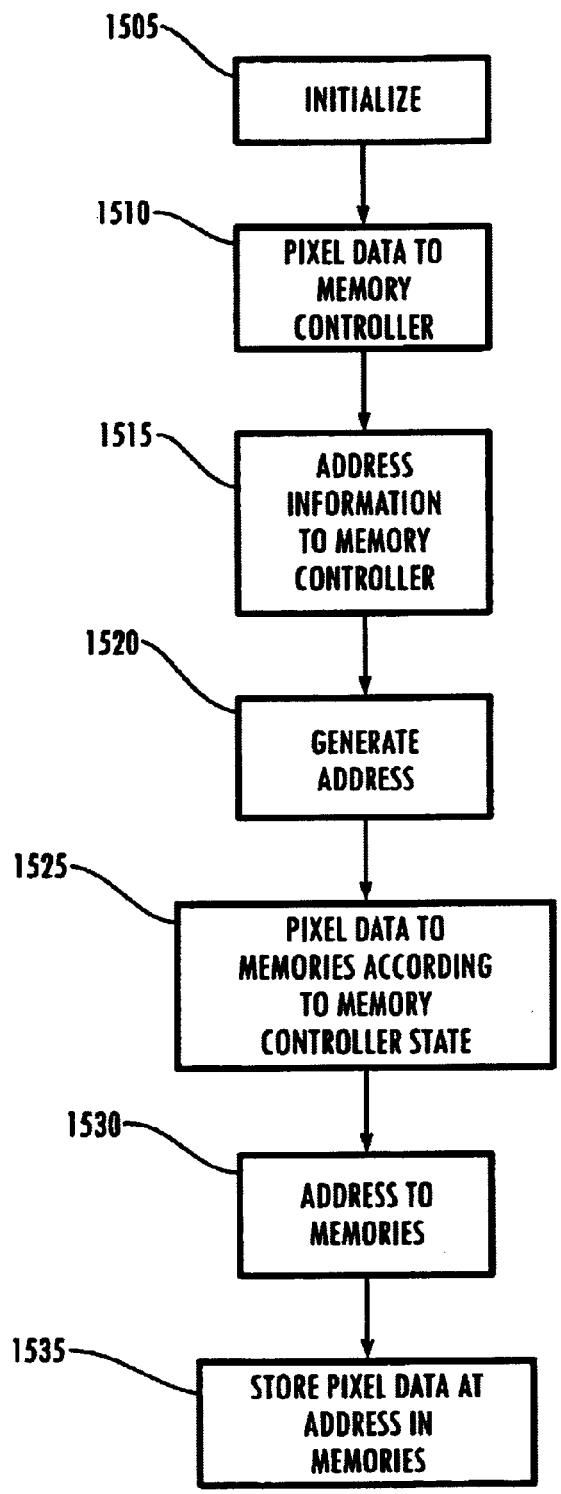
FIG. 15 is a flowchart of storing pixel data according to the present invention.

FIG. 15 is a flowchart of storing pixel data using architecture 1300 in FIG. 13. To store pixel data, memories 1310, 1315 are put in write mode and memory controller 1355 is set to provide pixel data from data buses 1307, 1309 to memories 1310, 1315, respectively, block 1505. Video source 1305 provides pixel data for a first pixel pair to memory controller 1355 through databuses 1307, 1309, respectively, block 1510. Video source 1305 also provides address information to memory controller 1355 through control line 1330, block 1515. The address information indicates that memory controller 1355 is to store data to memory 1310. In one implementation, the address information also indicates which half of the frame the current pixel pair is in. Alternatively, video source 1305 provides address information to memory controller 1355 once at the beginning of storage, such as at block 1505. Memory controller 1355 generates a source address, as described below, to store the pixel data, block 1520. In alternative implementations, video source 1305 can generate the addresses for storing pixel data and pass the addresses to memory controller 1355.

Memory controller 1355 passes the data to memories 1310, 1315 through memory buses 1365, 1375, respectively, according to the current state of memory controller 1355 for storing data, block 1525. As described above, in a first state, memory controller 1355 provides pixel data from first data bus 1307 to first memory 1310 and from second data bus 1309 to second memory 1315. In a second state, memory controller 1355 provides pixel data from first data bus 1307 to second memory 1315 and from second data bus 1309 to first memory 1310. Memory controller 1355 changes state for storing after storing pixel data for half of the frame of pixels.

Memory controller 1355 provides the address to memories 1310, 1315 through memory address buses 1365, 1375, respectively, block 1530. Memory 1310 stores the pixel data on memory data bus 1360 at the address on memory address bus 1365 and memory 1315 stores the pixel data on memory data bus 1370 at the address on memory address bus 1375, block 1535. To store pixel data for the next pixel, video source 1305 returns to block 1510, or to block 1505 to restore the state of architecture 1300 for storage.

Figure 16:
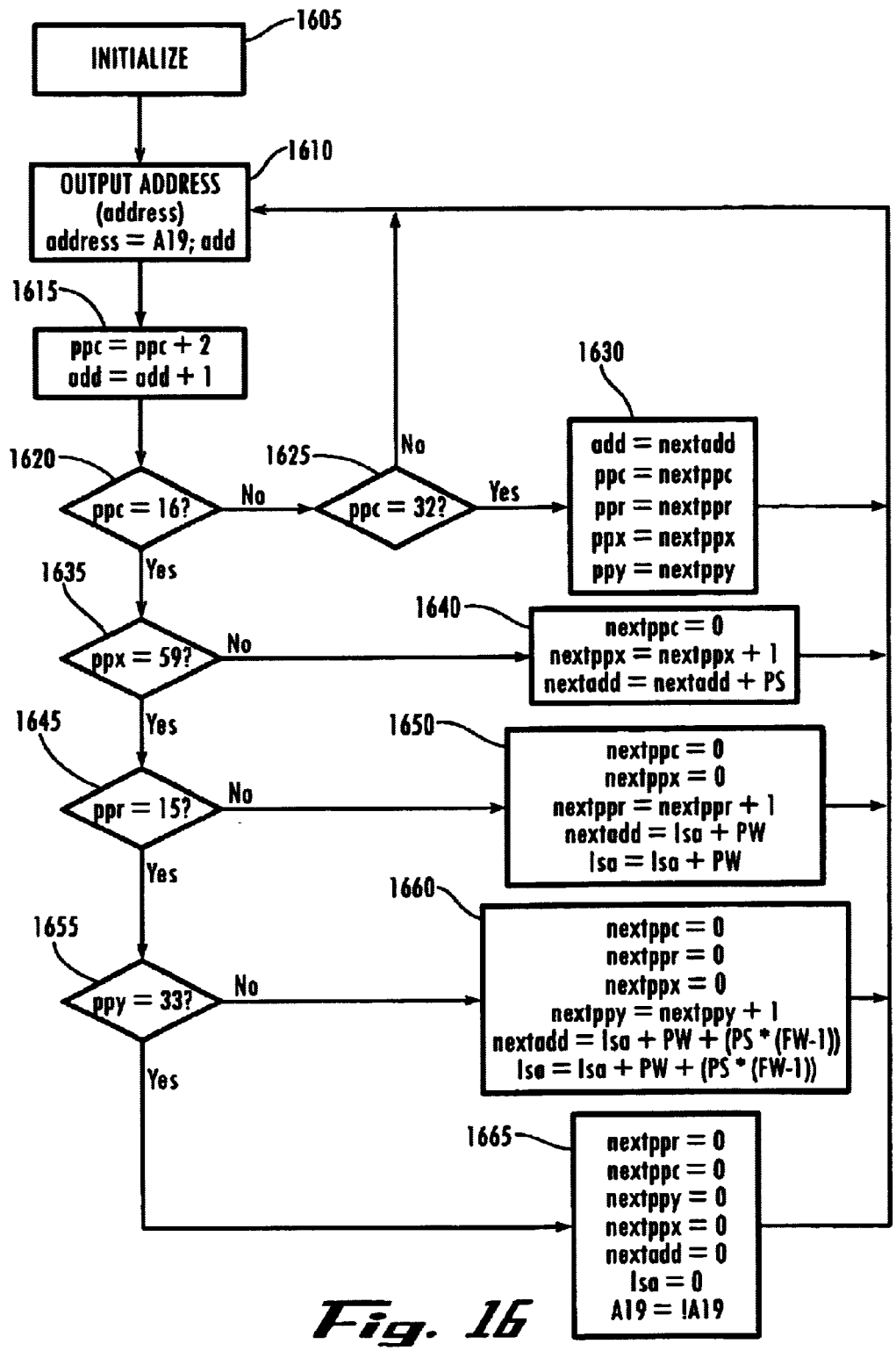
FIG. 16 is a flowchart of generating source addresses for storing pixel data according to the present invention.

FIG. 16 is a flowchart of generating source addresses for storing pixel data. One implementation uses architecture 1300, a pixel page geometry of 32×16, allocates 60 swapped pixel pages horizontally and 68 swapped pixel pages vertically, and allocates 2048 memory pages to each half of the frame of pixels (frame rows 0–543 and 544–1079, as described above). Accordingly, the addresses used for the upper half and lower half of the frame are different by one bit The source addresses are 20-bit addresses (including bits 0 through 19, or A0 through A19) to accommodate 4096 memory pages (each having 256 memory locations). In alternative implementations, the source addresses include different numbers of bits, such as 21.

For example, pixel data for the first pixel in the upper half of the frame (pixel 0 in frame row 0) is stored at address 0 and pixel data for the first pixel in the lower half of the frame (pixel 1044480 in frame row 544) is stored at address 524288. These addresses differ only in one bit (A19). For address 0, bit A19 is 0 and bits A0 through A18 are also each 0. For address 524288, bit A19 is 1 and bits A0 through A18 are also each 0. Accordingly, memory controller 1355 generates the same lower portion of the source address (using the variable add for bits A0–A18, as described below) for each half of the frame while changing one bit of the address for each half (using the variable A19, as described below).

Several counter variables are shown in FIG. 16. These counter variables can be values stored in memory or separate counters. "address" is the address generated and output at block 1610 as the source address. "add" is a 19-bit variable and forms part of the source address. "A19" is a one-bit variable used for the $20^{th}$ bit of the source address, bit A19. As shown in block 1610, address includes bits A0 through A19 and is the combination of variables A19 and add. Memory controller 1355 uses the value of variable A19 as bit A19 of address and the value of add as bits A0 through A18 of address. "ppc" counts pixel page columns. "ppr" counts pixel page rows. "ppx" counts swapped pixel pages horizontally. "ppy" counts swapped pixel pages vertically. "nextadd," "nextppc," "nextppr," "nextppx," "nextppy" are holding variables for assignment. "1sa" holds the left side address for the beginning of a frame row, i.e., the address to start from when generating addresses at the beginning of a row of pixels. Three constants are also shown in FIG. 16. "FW" is the frame width, indicating the number of swapped pixel pages allocated horizontally. FW is 60 in this implementation. "PW" is the page width, indicating the number of memory locations in each memory device allocated to pixels in one pixel page row. PW is 16 in this implementation. "PS" is the page size, indicating the number of memory locations in each memory device allocated to pixels in a swapped pixel page. PS is 256 in this implementation.

At the beginning of storing pixel data for a frame, memory controller 1355 resets the variables address, add, A19, ppc, ppr, ppx, ppy, nextadd, nextppc, nextppr, nextppx, nextppy, and 1sa to 0, block 1605. FW, PW, and PS do not change from frame to frame. Memory controller 1355 outputs the value of address as the source address, block 1610. Memory controller 1355 uses the value of variable A19 as bit A19 of address and the value of add for bits A0 through A18 of address. Memory controller 1355 increments ppc by 2 and increments add by 1, block 1615. Memory controller 1355 increments ppc by 2 because pixel data for two horizontally neighboring pixels is stored in parallel. Memory controller 1355 compares ppc with 16, block 1620. 16 is used because each swapped pixel page is 32 pixels wide and so 16 is the horizontal middle of the swapped pixel page. In some implementations, the amount of time required to perform some of the calculations in FIG. 16 may be more than a pixel time, and so using 16 as a branching point allows more time for some calculations to complete. Accordingly, processing may move from one block to another in FIG. 16 before the calculation shown in a block has completed. Alternatively, a value other than the horizontal middle of the swapped pixel page can be used.

If ppc does not equal 16, memory controller 1355 checks if the end of a swapped pixel page has been reached by comparing ppc with 32, block 1625. If ppc does not equal 32, the end of the swapped pixel page has not been reached, and memory controller 1355 proceeds to block 1610. If ppc equals 32, the end of the swapped pixel page has been reached. Memory controller 1355 prepares for the next swapped pixel page by assigning counter variables the values of corresponding holding variables, block 1630, and proceeds to block 1610.

If ppc equals, 16, memory controller 1355 checks if the last swapped pixel page in the row of swapped pixel pages has been reached by comparing ppx with 59, block 1635. If ppx does not equal 59, the last swapped pixel page in the row has not been reached. Memory controller 1355 prepares holding variables for the end of the pixel page row (to be used in block 1630), block 1640, and proceeds to block 1610.

If ppx equals 59, the last swapped pixel page in the row has been reached, and memory controller 1355 checks if the last pixel page row in the swapped pixel page has been reached by comparing ppr with 15, block 1645. If ppr does not equal 15, the last pixel page row has not been reached. Memory controller 1355 prepares holding variables for the end of the pixel page row (to be used in block 1630), block 1650, and proceeds to block 1610.

If ppr equals 15, the last pixel page row has been reached, and memory controller 1355 checks if the last swapped pixel page in the current half of the column of swapped pixel pages has been reached by comparing ppy with 33, block 1655. If ppy does not equal 33, the swapped last pixel page in the current half of the column has not been reached. Memory controller 1355 prepares holding variables for the end of the pixel page row (to be used in block 1630), block 1660, and proceeds to block 1610. If ppy equals 33, the last swapped pixel page in the current half of the column has been reached. Memory controller 1355 prepares holding variables for the end of the pixel page row (to be used in block 1630), block 1665, and proceeds to block 1610. In block 1665, memory controller 1355 sets variable A19 to its complement (A19=!A19) for changing to the next half of a frame. Memory controller 1355 sets A19 from 0 to 1 for changing from the upper half of a frame to the lower half of the same frame, or sets A19 from 1 to 0 for changing from the lower half of a frame to the upper half of the next frame.

In one implementation, in block 1665 memory controller 1355 also changes states for storing data. As described above, in a first state, memory controller 1355 provides pixel data from first data bus 1307 to first memory 1310 and from second data bus 1309 to second memory 1315. In a second state, memory controller 1355 provides pixel data from first data bus 1307 to second memory 1315 and from second data bus 1309 to first memory 1310. In one implementation, memory controller 1355 uses A19 as a flag indicating this storage state (e.g., A19=0 indicates the first state and A19=1 indicates the second state).

FIG. 16 shows a continuous loop and so memory controller 1355 continues to follow FIG. 16 from frame to frame for storing pixel data. If memory controller 1355 needs to re-start address generation for storing pixel data, such as to re-initialize the state of address generation, memory controller 1355 starts generating addresses again beginning with block 1605.

Memory controller 1355 retrieves pixel data according to vertical columns of pixels. Memory controller 1355 generates destination addresses to retrieve pixel data for two pixels in parallel, one from the upper half of a frame column and one from the lower half of a frame column. In an HD resolution implementation, memory controller 1355 retrieves pixel data for pixel pairs in this sequence (first memory 1310—second memory 1315): 0-1044480, 1920-1046400, 3840-1048320, . . . , 1044481-1, 1046401-1921, . . . , 2-1044482, and so on. Referring to FIG. 14, memory controller 1355 generates addresses in the following sequence (first pixel-second pixel): 0-524288, 16-524304, . . . , 1-524289, and so on. Memory controller 1355 switches which memory to supply which address to with each column. As described above, pixel data for pixels in different swapped pixel pages is retrieved from different memory pages.

FIG. 17 is a flowchart of retrieving pixel data. To retrieve pixel data, memories 1310, 1315 are put in read mode and memory controller 1355 is set to provide pixel data from memories 1310, 1315 to data buses 1327, 1329, respectively, block 1705. Video destination 1325 provides address information to memory controller 1355 through control line 1335, block 1710. The address information indicates that memory controller 1355 is to read data from memories 1310, 1315. Alternatively, video destination 1325 provides the address information to memory controller 1355 once at the beginning of retrieval, such as at block 1705. Memory controller 1355 generates two destination addresses as described below to retrieve the pixel data, block 1715. In alternative implementations, video destination 1325 can generate the addresses for retrieving pixel data and pass the addresses to memory controller 1355.

Memory controller 1355 provides the destination addresses to memories 1310, 1315 through memory address buses 1365, 1375, respectively, according to the current state of memory controller 1355 for retrieving data, block 1720. As described above, in a first state, memory controller 1355 provides pixel data from first memory 1310 to third data bus 1327 and from second memory 1315 to fourth data bus 1329. In addition, in the first state, memory controller 1355 provides the address for the pixel data for the first pixel in the vertical pixel pair (e.g., pixel 0 of pixel pair 0-1044480) to first memory 1310 and the address for the second pixel in the vertical pixel pair (e.g, pixel 1044480 of pixel pair 0-1044480) to second memory 1315. In a second state, memory controller 1355 provides pixel data from first data bus 1307 to second memory 1315 and from second data bus 1309 to first memory 1310. In addition, in the second state, memory controller 1355 provides the address for the pixel data for the first pixel in the vertical pixel pair (e.g., pixel 1 of pixel pair 1-1044481) to second memory 1315 and the address for the second pixel in the vertical pixel pair (e.g., pixel 1044481 of pixel pair 1-1044481) to first memory 1315. Memory controller 1355 changes state for retrieving data after retrieving pixel data for one vertical column of pixels.

Memory 1310 provides the pixel data stored at the address on memory address bus 1365 to memory controller 1355 through memory data bus 1360, and memory 1315 provides the pixel data stored at the address on memory address bus 1375 to memory controller 1355 through memory data bus 1370, block 1725. Memory controller 1355 provides the pixel data from memories 1310, 1315 to video destination 1325 through data buses 1327, 1329, respectively, according to the current state of memory controller 1355 for retrieving data, block 1730. To retrieve pixel data for the next pixel, video destination returns to block 1710, or to block 1705 to restore the state of architecture 1300 for retrieval.

Figure 18:
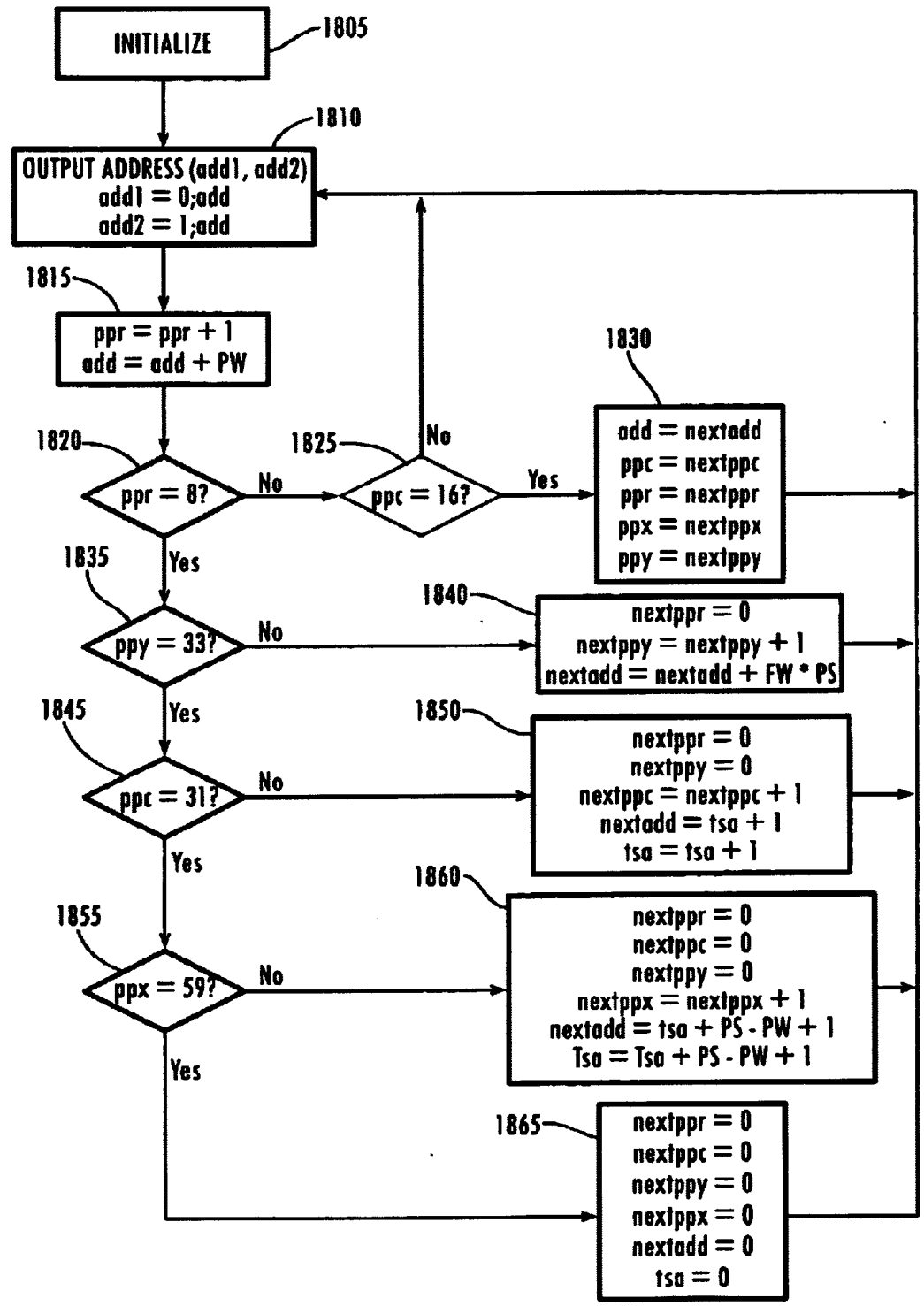
FIG. 18 is a flowchart of generating destination addresses for retrieving pixel data according to the present invention.

FIG. 18 is a flowchart of generating destination addresses for retrieving pixel data. As described above, one implementation uses architecture 1300, a pixel page geometry of 32×16, allocates 60 swapped pixel pages horizontally and 68 swapped pixel pages vertically, and allocates 2048 memory pages to each half of the frame of pixels (frame rows 0–543 and 544–1079, as described above). As described above referring to source addresses, the destination addresses are 20-bit addresses (including bits 0 through 19, or A0 through A19) and the destination addresses used for the upper half and lower half of the frame are different by one bit. Accordingly, memory controller 1355 generates the same lower portion of the destination address (using the variable add, as described below) for each half of the frame while setting one bit (bit A19, the 20$^{th}$ bit) of the address to 0 for the upper half and to 1 for the lower half of the frame. In alternative implementations, the destination addresses include different numbers of bits, such as 21.

As in FIG. 16, several variables and constants are shown in FIG. 18. "add1 " is the first destination address generated and output at block 1810. add1 is the address for pixel data for the pixel in the vertical pixel pair in the upper half of the frame. "add2" is the second destination address generated and output at block 1810. add2 is the address for pixel data for the pixel in the vertical pixel pair in the lower half of the frame. "add" forms part of each destination address. As shown in block 1810, add1 and add2 are 20-bit addresses, including bits A0 through A19. Memory controller 1355 forms add1 and add2 by combining a single bit and add, with the value of the extra bit as bit A19 of add1 or add2 and the value of add as bits A0 through A18. "ppc" counts pixel page columns. "ppr" counts pixel page rows. "ppx" counts swapped pixel pages horizontally. "ppy" counts swapped pixel pages vertically. "nextadd," "nextppc," "nextppr," "nextppx," "nextppy" are holding variables for assignment. "tsa" holds the top side address for the beginning of a frame column, i.e., the address to start from when generating addresses at the beginning of a column of pixels. "FW" is the frame width, indicating the number of swapped pixel pages allocated horizontally. FW is 60 in this implementation. "PW" is the page width, indicating the number of memory locations in each memory device allocated to pixels in one pixel page row. PW is 16 in this implementation. "PS" is the page size, indicating the number of memory locations in each memory device allocated to pixels in a swapped pixel page. PS is 256 in this implementation.

At the beginning of retrieving pixel data for a frame, memory controller 1355 resets the variables add, ppc, ppr, ppx, ppy, nextadd, nextppc, nextppr, nextppx, nextppy, and tsa to 0, block 1805. FW, PW, and PS do not change from frame to frame. Memory controller 1355 outputs the values of add1 and add2 as the destination addresses, block 1810. Memory controller 1355 uses a 0 as bit A19 for add1 and a 1 for bit A19 of add2. Memory controller 1355 uses the value of add for bits A0 through A18 of add1 and add2. Accordingly, the lower 19 bits of add1 and add2 have the same value, while bit A19 is different.

Memory controller 1355 increments ppr by 1, and add by PW, block 1815. Memory controller 1355 compares ppr with 8, block 1820. 8 is used because each swapped pixel page is 16 pixels tall and so 8 is the vertical middle of the swapped pixel page. As described above referring to FIG. 16, using 8 as a branching point allows more time for some calculations to complete.

If ppr does not equal 8, memory controller 1355 checks if the end of a swapped pixel page has been reached by comparing ppr with 16, block 1825. If ppr does not equal 16, the end of the swapped pixel page has not been reached, and memory controller 1355 proceeds to block 1810. If ppr equals 16, the end of the swapped pixel page has been reached. Memory controller 1355 prepares for the next swapped pixel page by assigning counter variables the values of corresponding holding variables, block 1830, and proceeds to block 1810.

In one implementation, in block 1830 memory controller 1355 also checks if the last swapped pixel page in the column of swapped pixel pages has been reached by comparing ppy with 33. Memory controller uses 33 (rather than 67) because pixel data is retrieved for the upper and lower half of the frame column in parallel. If ppy equals 33, the last swapped pixel page in the column of swapped pixel pages has been reached and, because ppr equals 16, the last pixel in the frame column of pixels has been processed so memory controller 1355 changes states for retrieving data. As described above, in a first state, memory controller 1355 provides the first address (add1) to first memory 1310 and the second address (add2) to second memory 1315, and provides pixel data from first memory 1310 to third bus 1327 and from second memory 1315 to fourth bus 1329. In a second state, memory controller 1355 provides the first address (add1) to second memory 1315 and the second address (add2) to first memory 1310, and provides pixel data from first memory 1310 to fourth bus 1329 and from second memory to third bus 1327. In one implementation, memory controller 1355 changes state for retrieving data when pixel data for a complete frame column of pixels has been retrieved, such as in block 1830 when ppy equals 33.

Returning to block 1820, if ppr equals 8, memory controller 1355 checks if the last swapped pixel page in the column of swapped pixel pages has been reached by comparing ppy with 33, block 1835. If ppy does not equal 33, the last swapped pixel page in the column has not been reached. Memory controller 1355 prepares holding variables for the end of the pixel page column (to be used in block 1830), block 1840, and proceeds to block 1810.

If ppy equals 33, the last swapped pixel page in the column has been reached, and memory controller 1355 checks if the last pixel page column in the swapped pixel page has been reached by comparing ppc with 31, block 1845. If ppc does not equal 31, the last pixel page column has not been reached. Memory controller 1355 prepares holding variables for the end of the pixel page column (to be used in block 1830), block 1850, and proceeds to block 1810.

If ppc equals 31, the last pixel page column has been reached, and memory controller 1355 checks if the last swapped pixel page in the row of swapped pixel pages has been reached by comparing ppx with 59, block 1855. If ppx does not equal 59, the last swapped pixel page in the row has not been reached. Memory controller 1355 prepares holding variables for the end of the pixel page column (to be used in block 1830), block 1860, and proceeds to block 1810. If ppx equals 59, the last swapped pixel page in the row has been reached. Memory controller 1355 prepares holding variables for the end of the pixel page column (to be used in block 1830), block 1865, and proceeds to block 1810.

Similar to FIG. 16, FIG. 18 shows a continuous loop and so memory controller 1355 continues to follow FIG. 18 from frame to frame for retrieving pixel data. If memory controller 1355 needs to re-start address generation for retrieving pixel data, such as to re-initialize the state of address generation, memory controller 1355 starts generating addresses again beginning with block 1805.

In alternative implementations, addresses generation for storing and retrieving pixel data can be different from that described above. For example, blocks 1620 and 1625 in FIG. 16 could be combined into a multi-branch block with outgoing paths depending on the value of ppc: one for ppc=16, one for ppc=32, and one for other values of ppc. In any case, the address generation used accommodates the storage pattern created by the swapped pixel pages and the sequences for storing and retrieving data described above.

C. Swapped Pixel Pages System Using Four Memory Devices and Bank Alternation

Increasing from the two memory devices of architecture 1300 in FIG. 13 to four memory devices can provide an increase in memory bandwidth. Furthermore, by dividing four memory devices into two banks of two memory devices each, pixel data can be stored and retrieved in parallel. Pixel data can be stored in one bank of memory devices and, during the same clock cycle, pixel data can be retrieved from the other bank. After storing one frame of pixel data, the banks switch roles.

Figure 19:
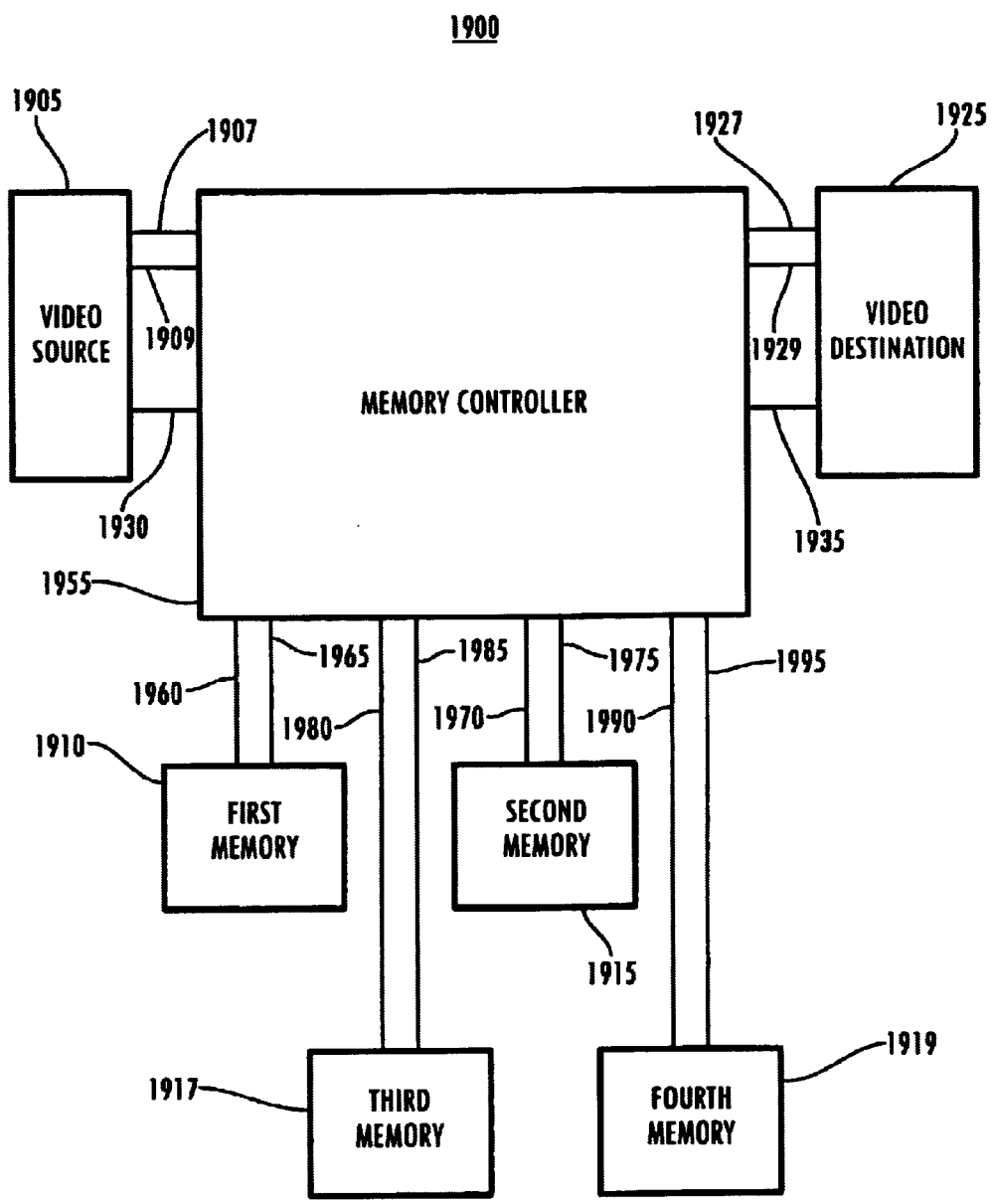
FIG. 19 is a block diagram of a dual pixel frame buffer architecture 1900 having four memory devices according to the present invention.

FIG. 19 is a block diagram of a dual pixel frame buffer architecture 1900 having four memory devices: first memory 1910, second memory 1915, third memory 1917, and fourth memory 1919. The memory devices are used in two alternating banks for storing and retrieving pixel data a frame at a time. Pixel data can be stored and retrieved as described above referring to using two memory devices. Swapped pixel pages can be allocated according to a power of 2 or to conserve memory space. Accordingly, the operation of storing and retrieving pixel data is similar to that described above for a two memory device implementation, however, the storing and retrieving occurs in parallel using respective memory banks.

For example, a first frame of pixel data is stored, two pixels at a time, in first memory 1910 and second memory 1915, as described above. A second frame of pixel data is then stored in third memory 1917 and fourth memory 1919. While the second frame is being stored, the first frame of pixel data is retrieved from first memory 1910 and second memory 1915, two pixels at a time, as described above. Accordingly, pixel data for the first frame is retrieved at the same time pixel data for the second frame is stored (i.e., during the same clock cycle). During every clock cycle, pixel data for one frame is stored and pixel data previously stored is retrieved. For the next frames, the memory banks are switched. The third frame of pixel data is stored in first memory 1910 and second memory 1915, while the second frame of pixel data is retrieved from third memory 1917 and fourth memory 1919. This alternation between memory banks continues as long as frames are supplied to video source 1905.

Architecture 1900 is similar to architecture 1300 in FIG. 13. In architecture 1900, memory controller 1955 controls address generation and routing pixel data to and from memories 1910, 1915, 1917, and 1919 in parallel. Architecture 1900 also has additional memory data buses 1980, 1990 and memory address buses 1985, 1995. Memory controller 1955 has two states for bank alternation (in addition to states for storing and retrieving data, as described above): (A) connecting data buses 1907 and 1909 to memories 1910 and 1915, respectively, and data buses 1927 and 1929 to memories 1917 and 1919, respectively; and (B) connecting data buses 1907 and 1909 to memories 1917 and 1919, respectively, and data buses 1927 and 1929 to memories 1910 and 1915, respectively. Accordingly, in state A while memory data buses 1960 and 1970 are providing pixel data to be stored to first memory 1910 and second memory 1915, respectively, memory data buses 1980 and 1990 are providing pixel data retrieved from third memory 1917 and fourth memory 1919, respectively. Conversely, in state B while memory data buses 1960 and 1970 are providing pixel data retrieved from first memory 1910 and second memory 1915, respectively, memory data buses 1980 and 1990 are providing pixel data to be stored to third memory 1917 and fourth memory 1919, respectively. Memory controller 1955 receives a control signal to switch between states, such as from video source 1905 on control line 1930. Video source 1905 toggles the control signal after completing storing pixel data for a frame. In one implementation, memory controller 1955 is connected to a flip-flop that is triggered by a vertical synchronization signal supplied by video source 1905. In this way, memory controller 1955 changes states after storing pixel data for one frame of pixels. In addition, while clock lines are not shown in FIG. 19, architecture 1900 operates based on clock cycles so that pixel data can be processed for four pixels per clock cycle in support of the desired pixel rate. In an alternative implementation, separate address generators for storing and retrieving data provide addresses to memory controller 1955. In another alternative implementation, a separate memory controller is provided for and connected to each bank of memory devices and generates addresses for the connected memory devices.

In an alternative implementation, memory controller 1955 is replaced by address multiplexors and data switches. A 4×4 data switch controls bank alternation. Two 2×2 data switches control switching between memories for storing and retrieving data to provide the mapping of swapped pixel pages in each bank of memory devices. Address generation is controlled by the video source and the video destination for storing and retrieving pixel data, respectively, and the address multiplexors are used to control supplying addresses to the memories.

Figure 20:
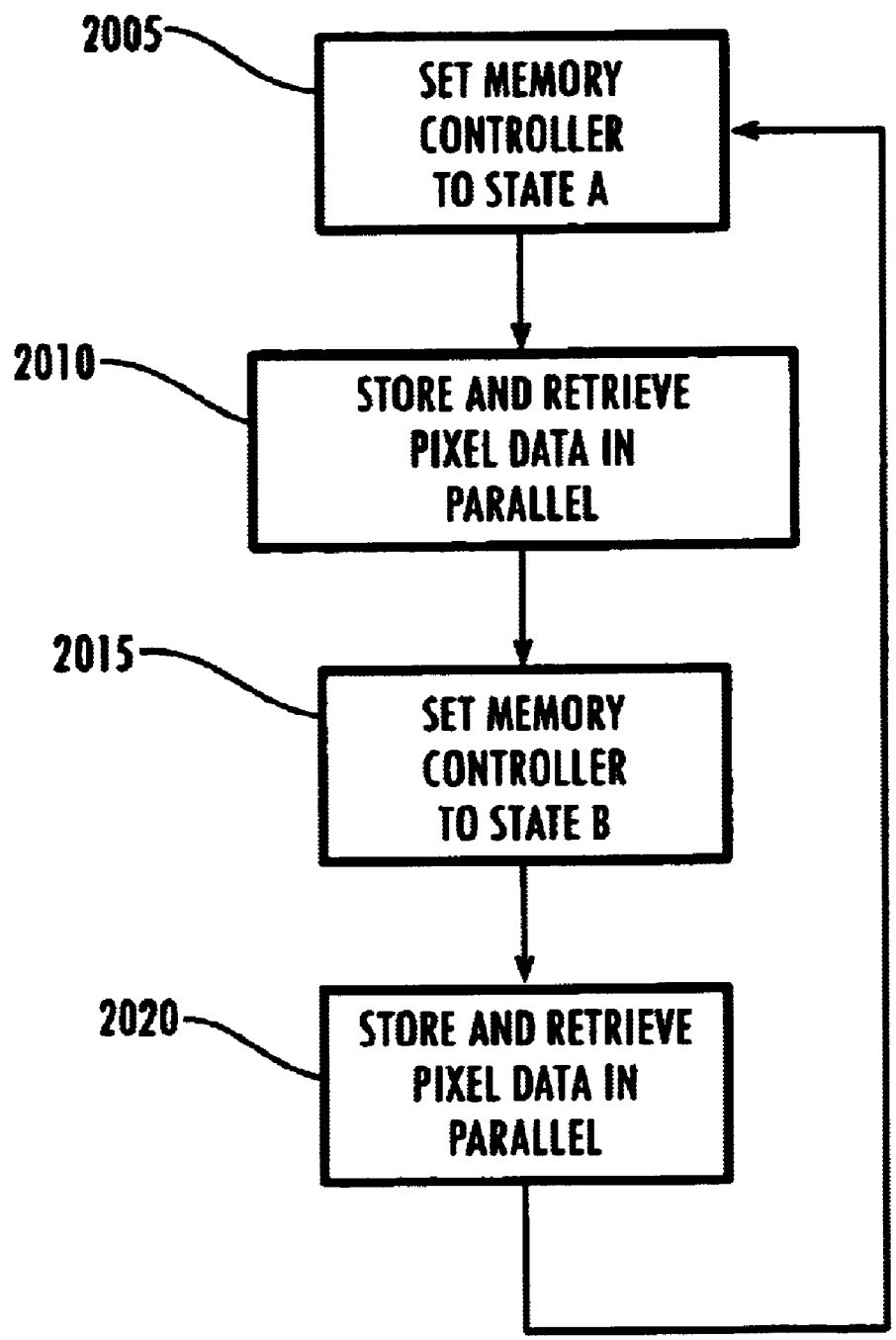
FIG. 20 is a flowchart of storing and retrieving pixel data in parallel using bank alternation according to the present invention.

FIG. 20 is a flowchart of storing and retrieving pixel data in parallel using bank alternation, such as in architecture 1900 of FIG. 19. When a first frame of pixel data becomes available to video source 1905, video source 1905 sets memory controller 1955 to state A (pixel data to be stored to first memory 1910 and second memory 1915, pixel data to be retrieved from third memory 1917 and fourth memory 1919), block 2005. Memory controller 1955 stores the first frame of pixel data, two pixels at a time, in first memory 1910 and second memory 1915, as described above, and memory controller 1955 retrieves pixel data from third memory 1917 and fourth memory 1919, as described above, block 2010. Initially, pixel data has not been stored in memories 1917 and 1919, and so pixel data retrieved during the first loop may not produce a desirable image. After a frame of pixel data has been stored, video source 1905 sets memory controller 1955 to state B (pixel data to be retrieved from first memory 1910 and second memory 1915, pixel data to be stored to third memory 1917 and fourth memory 1919), block 2015. Memory controller 1955 stores a frame of pixel data and retrieves pixel data for another frame according to the state of memory controller 1955, as described above, block 2020. After a frame of pixel data has been stored, video source 1905 returns to block 2005 and sets memory controller 1955 to state A. When a new frame is not available to video source 1905, storing and retrieving pixels from architecture 1900 is complete. When a new frame later becomes available, video source 1905 begins at block 2005 again.

Various illustrative implementations of the present invention have been described. The above description focuses on HD resolution video data displayed using a GLV system, but the methods and apparatus can be applied to different resolutions and different devices, as well as data other than video data. Similarly, the pixel data for a pixel is described above as being 32 bits, but different depths are also possible with modification to the size of the addressed memory locations. In addition, various implementations are described in related U.S. application Ser. No. 10/051,538, filed Jan. 16, 2002 and alternative implementations of swapped pixel page systems based on implementations described therein will be apparent to one of ordinary skill in the art, such as using burst accessing, memory sections, data switches.

The present invention can be implemented in electronic circuitry, computer hardware, software, or in combinations of them. For example, a frame buffer using swapped pixel pages can be implemented in various ways, such as with an FPGA, a hardwired design, a microprocessor architecture, or a combination. However, one of ordinary skill in the art will see that additional implementations are also possible and within the scope of the present invention. Accordingly, the present invention is not limited to only those implementations described above.

What is claimed is:

1. A swapped pixel page system, comprising:
    a data source, providing pixel data for pixels in a first order, where each pixel is in a frame of pixels, the frame having horizontal rows of pixels, vertical columns of pixels, a first portion and a second portion;
    a data destination, receiving pixel data for pixels in a second order; and
    at least two memory devices, each memory device having a plurality of memory pages including a plurality of memory locations, each memory location having an address;
    where pixel data for each pixel corresponds to an entry in one of a plurality of swapped pixel pages, each swapped pixel page having a plurality of pixel page rows each including a plurality of pixels and a plurality of pixel page columns each including a plurality of pixels, where pixel data is stored to the memory devices in the first order and retrieved from the memory devices in the second order, and where each memory page stores pixel data in multiple locations according to the first order and stores pixel data in multiple locations according to the second order, and where pixel data is retrieved in parallel for two pixels from different portions of the frame of pixels.

2. The swapped pixel page system of claim 1, where the data destination is connected to a GLV system and provides pixel data to the GLV system.

3. The swapped pixel page system of claim 2, where the data destination provides pixel data for a pixel from the first portion of the frame of pixels to a first driver of the GLV system and provides pixel data for a pixel from the second portion of the frame of pixels to a second driver of the GLV system.

4. The swapped pixel page system of claim 1, where the at least two memory devices includes a first memory device and a second memory device, and where swapped pixel pages in the first portion of the frame indicate pixel data for pixels in the first pixel page column are to be stored to the first memory device and swapped pixel pages in the second portion of the frame indicate pixel data for pixels in the first pixel page column are to be stored to the second memory device.

5. The swapped pixel page system of claim 4, where swapped pixel pages in the first portion of the frame indicate pixel data for pixels in the second pixel page column are to be stored to the second memory device and swapped pixel pages in the second portion of the frame indicate pixel data for pixels in the second pixel page column are to be stored to the first memory device.

6. The swapped pixel page system of claim 1, where each pixel page column indicates pixel data for pixels in that pixel page column are to be stored to a different memory device than pixel data for pixels in a horizontally adjacent pixel page column.

7. The swapped pixel page system of claim 1, where pixel data for two horizontally adjacent pixels is stored in parallel to respective memory devices, and pixel data for two pixels in the same vertical column of pixels in the frame is retrieved in parallel.

8. The swapped pixel page system of claim 7, where pixel data for two non-adjacent pixels in the same vertical column of pixels in the frame is retrieved in parallel.

9. The swapped pixel page system of claim 1, where each swapped pixel page has a pixel page geometry of 32×16.

10. The swapped pixel page system of claim 1, further comprising a memory controller, where the memory controller generates addresses for storing and retrieving pixel data.

11. The swapped pixel page system of claim 10, where:
the at least two memory devices comprises a first memory device and a second memory device, and
the memory controller has two states for storing data for a horizontal pixel pair, where a first pixel in the horizontal pixel pair is horizontally adjacent and to the left of a second pixel in the horizontal pixel pair: a first state where pixel data for the first pixel in the horizontal pixel pair is stored to the first memory device and pixel data for the second pixel in the horizontal pixel pair is stored to the second memory device; and a second state where pixel data for the first pixel in the horizontal pixel pair is stored to the second memory device and pixel data for the second pixel in the horizontal pixel pair is stored to the first memory device.

12. The swapped pixel page system of claim 11, where the memory controller changes states for storing pixel data after storing pixel data for half of the frame of pixels.

13. The swapped pixel page system of claim 10, where:
the at least two memory devices comprises a first memory device and a second memory device, and
the memory controller has two states for retrieving data for a vertical pixel pair, where a first pixel in the vertical pixel pair is in the first portion of the frame and a second pixel in the vertical pixel pair is in the second portion of the frame, and the first pixel in the vertical pixel pair is in the same vertical column of pixels as a second pixel in the vertical pixel pair but the pixels in the vertical pixel pair are not adjacent: a first state where pixel data for the first pixel in the vertical pixel pair is retrieved from the first memory device and pixel data for the second pixel in the vertical pixel pair is retrieved from the second memory device; and a second state where pixel data for the first pixel in the vertical pixel pair is retrieved from the second memory device and pixel data for the second pixel in the vertical pixel pair is retrieved from the first memory device.

14. The swapped pixel page system of claim 13, where:
pixel data for the first pixel in the vertical pixel pair is retrieved using a first address,
pixel data for the second pixel in the vertical pixel pair is retrieved using a second address,
in the first state for retrieving data, the first address is provided to the first memory device and the second address is provided to the second memory device, and
in the second state for retrieving data, the first address is provided to the second memory device and the second address is provided to the first memory device.

15. The swapped pixel page system of claim 13, where the memory controller changes states for retrieving pixel data after retrieving pixel data for one vertical column of pixels.

16. The swapped pixel page system of claim 10, where:
the at least two memory devices includes a first memory device and a second memory device forming a first bank, and a third memory device and a fourth memory device forming a second bank, and
the memory controller has two states for bank alternation: storing pixel data to the first memory device and the second memory device while retrieving pixel data from the third memory device and the fourth memory device, and retrieving pixel data from the first memory device and the second memory device while storing pixel data to the third memory device and the fourth memory device.

17. The swapped pixel page system of claim 10, where the memory controller changes states for bank alternation after storing pixel data for one frame of pixels.

18. The swapped pixel page system of claim 1, where:
the at least two memory devices includes a first memory device and a second memory device forming a first bank, and a third memory device and a fourth memory device forming a second bank, and
the swapped pixel page system has two states for bank alternation: storing pixel data to the first memory device and the second memory device while retrieving pixel data from the third memory device and the fourth memory device, and retrieving pixel data from the first memory device and the second memory device while storing pixel data to the third memory device and the fourth memory device.

19. The swapped pixel page system of claim 1, where the swapped pixel page system changes states for bank alternation after storing pixel data for one frame of pixels.

20. The swapped pixel page system of claim 1, where each portion of the frame includes a plurality of the horizontal rows of pixels and at least a portion of a plurality of the vertical columns of pixels.

21. A swapped pixel page system, comprising:
a data source, providing pixel data in a first order, where each pixel is in a frame of pixels, the frame having horizontal rows of pixels and vertical columns of pixels;
a GLV system, receiving pixel data for pixels in a second order, and
a scan converter system connected to the data source and to the GLV system, where the scan converter system includes multiple memory pages, stores and retrieves pixel data using swapped pixel pages, and stores pixel data for multiple pixels in a memory page according to the first order and retrieves pixel data for multiple pixels from the memory page according to the second order;
where pixel data is retrieved in parallel for two pixels from different portions of the frame of pixels.

22. The swapped pixel page system of claim 21, where each portion of the frame includes a plurality of the horizontal rows of pixels and at least a portion of a plurality of the vertical columns of pixels.

23. A method of storing pixel data, comprising:
storing pixel data for a first pixel and a second pixel in parallel in a first memory and a second memory, respectively, where the first pixel and the second pixel are pixels in a frame of pixels, where the frame includes multiple horizontal rows of pixels and multiple vertical columns of pixels, and where the first pixel is the leftmost pixel in the first horizontal row of pixels in a first portion of the frame and the second pixel is horizontally adjacent to the first pixel; and
storing pixel data for a third pixel and a fourth pixel in parallel in the second memory and the first memory, respectively, where the third pixel is the leftmost pixel in the first horizontal row of pixels in a second portion of the frame and is in the same vertical column of pixels as the first pixel, and the fourth pixel is horizontally adjacent to the third pixel.

24. The method of claim 23, where:
pixel data for pixels in the first portion of the frame that are in a first vertical column is stored in the first memory device,
pixel data for pixels in the first portion of the frame that are in a second vertical column, adjacent to the first vertical column, is stored in the second memory device,
pixel data for pixels in the second portion of the frame that are in the first vertical column is stored in the second memory device, and
pixel data for pixels in the second portion of the frame that are in the second vertical column is stored in the first memory device.

25. The method of claim 23, further comprising providing pixel data to a GLV system.

26. The method of claim 23, where each portion of the frame includes a plurality of the horizontal rows of pixels and at least a portion of a plurality of the vertical columns of pixels.

27. A method of retrieving pixel data, comprising:
retrieving pixel data for a first pixel and a second pixel in parallel from a first memory and a second memory, respectively, where the first pixel and the second pixel are pixels in a frame of pixels, where the frame includes multiple horizontal rows of pixels and multiple vertical columns of pixels, and where the first pixel is the topmost pixel in a first portion of the first vertical column of pixels in the frame and the second pixel is the topmost pixel in a second portion of the first vertical column of pixels; and
retrieving pixel data for a third pixel and a fourth pixel in parallel from the second memory and the first memory, respectively, where the third pixel is the topmost pixel in the first portion of the second vertical column of pixels in the frame and is horizontally adjacent to the first pixel, and the fourth pixel is the topmost pixel in the second portion of the second vertical column of pixels.

28. The method of claim 27, where:
pixel data for pixels in the first portion of the frame that are in a first vertical column is retrieved from the first memory device,
pixel data for pixels in the first portion of the frame that are in a second vertical column, adjacent to the first vertical column, is retrieved from the second memory device,
pixel data for pixels in the second portion of the frame that are in the first vertical column is retrieved from the second memory device, and
pixel data for pixels in the second portion of the frame that are in the second vertical column is retrieved from the first memory device.

29. The method of claim 27, further comprising providing pixel data to a GLV system.

30. The method of claim 27, where each portion of the frame includes a plurality of the horizontal rows of pixels and at least a portion of a plurality of the vertical columns of pixels.

31. A system for storing and retrieving pixel data, comprising:
means for storing pixel data for a first pixel and a second pixel in parallel in a first memory and a second memory, respectively, where the first pixel and the second pixel are pixels in a frame of pixels, where the frame includes multiple horizontal rows of pixels and multiple vertical columns of pixels, and where the first pixel is the leftmost pixel in the first horizontal row of pixels in a first portion of the frame and the second pixel is horizontally adjacent to the first pixel;
means for storing pixel data for a third pixel and a fourth pixel in parallel in the second memory and the first memory, respectively, where the third pixel is the leftmost pixel in the first horizontal row of pixels in a second portion of the frame and is in the same vertical column of pixels as the first pixel, and the fourth pixel is horizontally adjacent to the third pixel;
means for retrieving pixel data for the first pixel and the third pixel in parallel from the first memory and the second memory, respectively; and
means for retrieving pixel data for the second pixel and the fourth pixel in parallel from the second memory and the first memory, respectively.

32. The system of claim 31, where:
pixel data for pixels in the first portion of the frame that are in a first vertical column is stored in the first memory device, pixel data for pixels in the first portion of the frame that are in a second vertical column, adjacent to the first vertical column, is stored in the second memory device, pixel data for pixels in the second portion of the frame that are in the first vertical column is stored in the second memory device, pixel data for pixels in the second portion of the frame that are in the second vertical column is stored in the first memory device, pixel data for pixels in the first portion of the frame that are in a first vertical column is retrieved from the first memory device, pixel data for pixels in the first portion of the frame that are in a second vertical column, adjacent to the first vertical column, is retrieved from the second memory device, pixel data for pixels in the second portion of the frame that are in the first vertical column is retrieved from the second memory device, and pixel data for pixels in the second portion of the frame that are in the second vertical column is retrieved from the first memory device.

33. The system of claim 31, where each portion of the frame includes a plurality of the horizontal rows of pixels and at least a portion of a plurality of the vertical columns of pixels.

* * * * *

UNITED STATES PATENT AND TRADEMARK OFFICE
CERTIFICATE OF CORRECTION

PATENT NO. : 7,046,249 B2  Page 1 of 1
APPLICATION NO. : 10/882490
DATED : May 16, 2006
INVENTOR(S) : Champion et al.

It is certified that error appears in the above-identified patent and that said Letters Patent is hereby corrected as shown below:

In the CLAIMS:

Claim 21, column 31, line 15, after "order" delete "," (comma) and insert --;-- (semicolon).

Signed and Sealed this

Thirteenth Day of February, 2007

JON W. DUDAS
*Director of the United States Patent and Trademark Office*